United States Patent
Huang

(10) Patent No.: US 11,062,985 B2
(45) Date of Patent: Jul. 13, 2021

(54) WIRING STRUCTURE HAVING AN INTERMEDIATE LAYER BETWEEN AN UPPER CONDUCTIVE STRUCTURE AND CONDUCTIVE STRUCTURE

(71) Applicant: Advanced Semiconductor Engineering, Inc., Kaohsiung (TW)

(72) Inventor: Wen Hung Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/529,562

(22) Filed: Aug. 1, 2019

(65) Prior Publication Data

US 2021/0035897 A1    Feb. 4, 2021

(51) Int. Cl.

| | |
|---|---|
| *H01L 23/12* | (2006.01) |
| *H01L 23/48* | (2006.01) |
| *H01L 21/4763* | (2006.01) |
| *H01L 23/498* | (2006.01) |
| *H01L 21/3205* | (2006.01) |
| *H05K 3/46* | (2006.01) |
| *H05K 3/42* | (2006.01) |
| *H01L 23/522* | (2006.01) |
| *H01L 23/495* | (2006.01) |
| *H01L 21/768* | (2006.01) |
| *H01L 23/528* | (2006.01) |

(52) U.S. Cl.
CPC .... *H01L 23/49822* (2013.01); *H01L 21/3205* (2013.01); *H01L 21/76877* (2013.01); *H01L 21/76898* (2013.01); *H01L 23/49527* (2013.01); *H01L 23/49838* (2013.01); *H01L 23/5226* (2013.01); *H05K 3/429* (2013.01); *H05K 3/4644* (2013.01); *H01L 23/49816* (2013.01); *H01L 23/528* (2013.01)

(58) Field of Classification Search
CPC .......... H01L 23/49822; H01L 21/3205; H01L 23/49838; H01L 23/49534; H01L 23/49527; H01L 23/528; H01L 21/76877; H01L 23/481; H01L 23/5226; H05K 3/429; H05K 3/4644
See application file for complete search history.

(56) References Cited

U.S. PATENT DOCUMENTS

| | | | | |
|---|---|---|---|---|
| 10,892,213 | B2 * | 1/2021 | Huang | ............... H01L 21/486 |
| 2006/0083895 | A1 * | 4/2006 | Ikeda | ..................... B32B 7/02 |
| | | | | 428/137 |

(Continued)

*Primary Examiner* — Alonzo Chambliss
(74) *Attorney, Agent, or Firm* — Foley & Lardner LLP

(57) ABSTRACT

A wiring structure includes an upper conductive structure, a lower conductive structure, a plurality of metallic structures and an intermediate layer. The upper conductive structure includes at least one dielectric layer and at least one circuit layer in contact with the dielectric layer. The lower conductive structure includes at least one dielectric layer and at least one circuit layer in contact with the dielectric layer. The metallic structures are disposed between the upper conductive structure and the lower conductive structure, and electrically connecting the upper conductive structure and the lower conductive structure. The intermediate layer is disposed between the upper conductive structure and the lower conductive structure, and covers the metallic structures.

18 Claims, 30 Drawing Sheets

(56) References Cited

U.S. PATENT DOCUMENTS

| | | | | |
|---|---|---|---|---|
| 2012/0024583 A1* | 2/2012 | Lee | ............... | H05K 1/186 |
| | | | | 174/260 |
| 2012/0247813 A1* | 10/2012 | Ueda | ............... | H01L 23/49822 |
| | | | | 174/251 |
| 2013/0081870 A1* | 4/2013 | Furutani | ............... | H05K 3/445 |
| | | | | 174/262 |
| 2013/0299227 A1* | 11/2013 | Chung | ............... | H05K 3/10 |
| | | | | 174/266 |
| 2020/0211945 A1* | 7/2020 | Huang | ............... | H01L 23/544 |

\* cited by examiner

WIRING STRUCTURE HAVING AN INTERMEDIATE LAYER BETWEEN AN UPPER CONDUCTIVE STRUCTURE AND CONDUCTIVE STRUCTURE

BACKGROUND

1. Field of the Disclosure

The present disclosure relates to a wiring structure, and a manufacturing method, and to a wiring structure including at least two conductive structures electrically connected to each other by at least one metallic structure therebetween, and a method for manufacturing the same.

2. Description of the Related Art

Along with the rapid development in electronics industry and the progress of semiconductor processing technologies, semiconductor chips are integrated with an increasing number of electronic components to achieve improved electrical performance and additional functions. Accordingly, the semiconductor chips are provided with more input/output (I/O) connections. To manufacture semiconductor packages including semiconductor chips with an increased number of I/O connections, circuit layers of semiconductor substrates used for carrying the semiconductor chips may correspondingly increase in size. Thus, a thickness and a warpage of a semiconductor substrate may correspondingly increase, and a yield of the semiconductor substrate may decrease.

SUMMARY

In some embodiments, a wiring structure includes an upper conductive structure, a lower conductive structure, a plurality of metallic structures and an intermediate layer. The upper conductive structure includes at least one dielectric layer and at least one circuit layer in contact with the dielectric layer. The lower conductive structure includes at least one dielectric layer and at least one circuit layer in contact with the dielectric layer. The metallic structures are disposed between the upper conductive structure and the lower conductive structure, and electrically connecting the upper conductive structure and the lower conductive structure. The intermediate layer is disposed between the upper conductive structure and the lower conductive structure, and covers the metallic structures.

In some embodiments, a wiring structure includes a low-density stacked structure, a high-density stacked structure and a plurality of metallic structures. The low-density stacked structure includes at least one dielectric layer and at least one low-density circuit layer in contact with the dielectric layer. The high-density stacked structure includes at least one dielectric layer and at least one high-density circuit layer in contact with the dielectric layer. The metallic structures are disposed between the upper conductive structure and the lower conductive structure, and electrically connect the upper conductive structure and the lower conductive structure. A material of each of the metallic structures includes at least one build-up metal layer.

In some embodiments, a method for manufacturing a wiring structure includes: (a) providing a lower conductive structure, an upper conductive structure and at least one dent structure, wherein the at least one dent structure is disposed between the upper conductive structure and the lower conductive structure to form a gap between the upper conductive structure and the lower conductive structure, wherein a portion of a circuit layer of the upper conductive structure and a portion of a circuit layer of the lower conductive structure are exposed in the gap and aligned with each other; and (b) concurrently forming a plurality of upper metallic portions in contact with the exposed portion of the circuit layer of the upper conductive structure, and a plurality of lower metallic portions in contact with the exposed portion of the circuit layer of the lower conductive structure, wherein the upper metallic portions connect the lower metallic portions to form a plurality of metallic structures.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
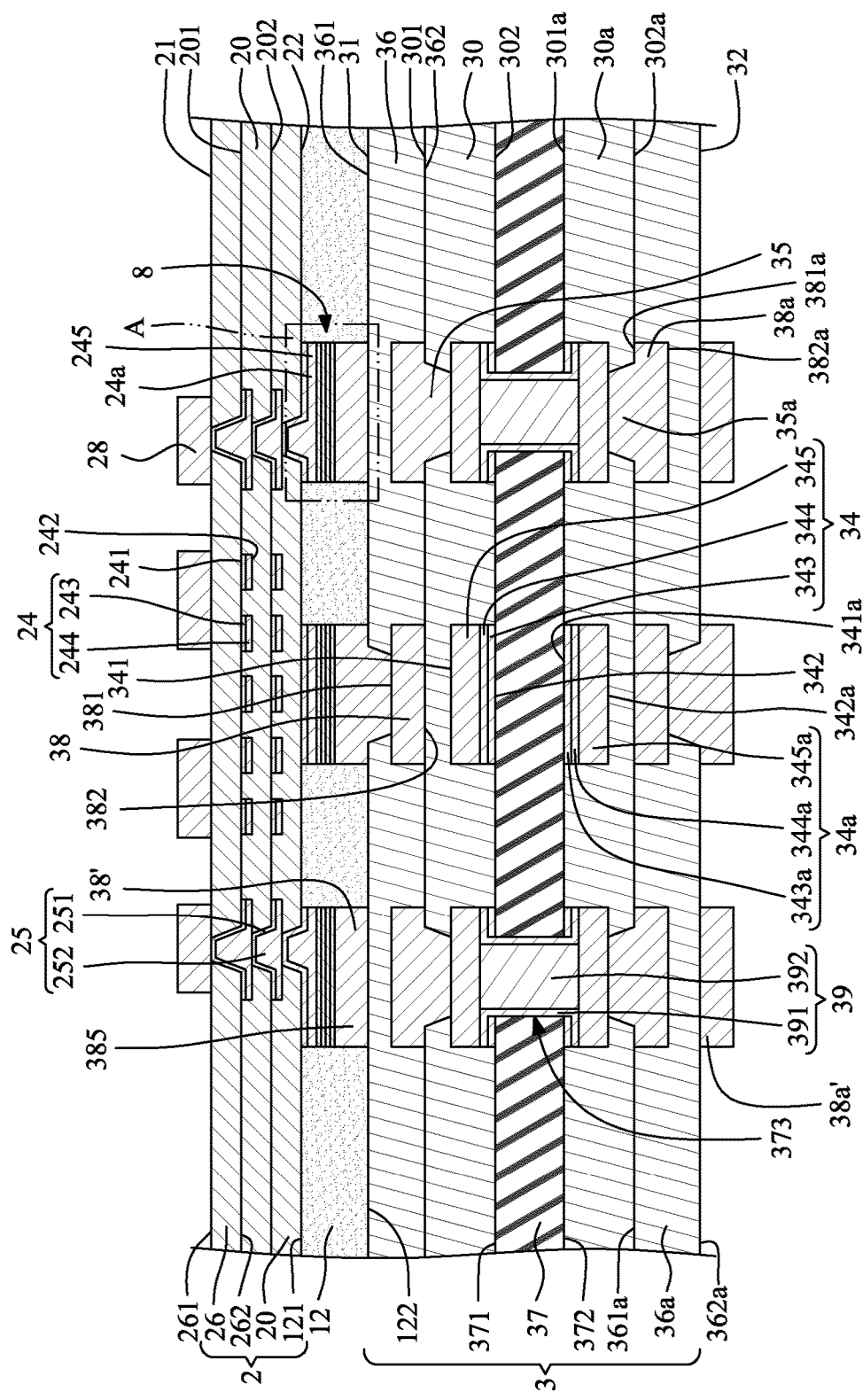
FIG. 1 illustrates a cross-sectional view of a wiring structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

To meet the specification of increasing I/O counts, a number of dielectric layers of a substrate should increase. In some comparative embodiments, a manufacturing process of a core substrate may include the following stages. Firstly, a core with two copper foils disposed on two sides thereof is provided. Then, a plurality of dielectric layers and a plurality of circuit layers are formed or stacked on the two copper foils. One circuit layer may be embedded in one corresponding dielectric layer. Therefore, the core substrate may include a plurality of stacked dielectric layers and a plurality of circuit layers embedded in the dielectric layers on both sides of the core. Since a line width/line space (L/S) of the circuit layers of such core substrate may be greater than or equal to 10 micrometers (μm)/10 μm, the number of the dielectric layers of such core substrate is relatively large. Although the manufacturing cost of such core substrate is low, the manufacturing yield for the circuit layers and the dielectric layers of such core substrate is also low, and, thus, the yield of such core substrate is low. In addition, each dielectric layer is relatively thick, and, thus, such core substrate is relatively thick. In some comparative embodiments, if a package has 10000 I/O counts, such core substrate may include twelve layers of circuit layers and dielectric layers. The manufacturing yield for one layer (including one circuit layer and one dielectric layer) of such core substrate may be 90%. Thus, the yield of such core substrate may be $(0.9)^{12}$=28.24%. In addition, warpage of the twelve layers of circuit layers and dielectric layers may be accumulated, and, thus, the top several layers may have severe warpage. As a result, the yield of such core substrate may be further reduced.

To address the above concerns, in some comparative embodiments, a coreless substrate is provided. The coreless substrate may include a plurality of dielectric layers and a plurality of fan-out circuit layers. In some embodiments, a manufacturing process of a coreless substrate may include the following stages. Firstly, a carrier is provided. Then, a plurality of dielectric layers and a plurality of fan-out circuit layers are formed or stacked on a surface of the carrier. One fan-out circuit layer may be embedded in one corresponding dielectric layer. Then, the carrier is removed. Therefore, the coreless substrate may include a plurality of stacked dielectric layers and a plurality of fan-out circuit layers embedded in the dielectric layers. Since a line width/line space (L/S) of the fan-out circuit layers of such coreless substrate may be less than or equal to 2 μm/2 μm, the number of the dielectric layers of such coreless substrate can be reduced. Further, the manufacturing yield for the fan-out circuit layers and the dielectric layers of such coreless substrate is high. For example, the manufacturing yield for one layer (including one fan-out circuit layer and one dielectric layer) of such coreless substrate may be 99%. However, the manufacturing cost of such coreless substrate is relatively high.

At least some embodiments of the present disclosure provide for a wiring structure which has an advantageous compromise of yield and manufacturing cost. In some embodiments, the wiring structure includes an upper conductive structure and a lower conductive structure bonded to the upper conductive structure through a plurality of metallic structures. At least some embodiments of the present disclosure further provide for techniques for manufacturing the wiring structure.

Figure 1A:
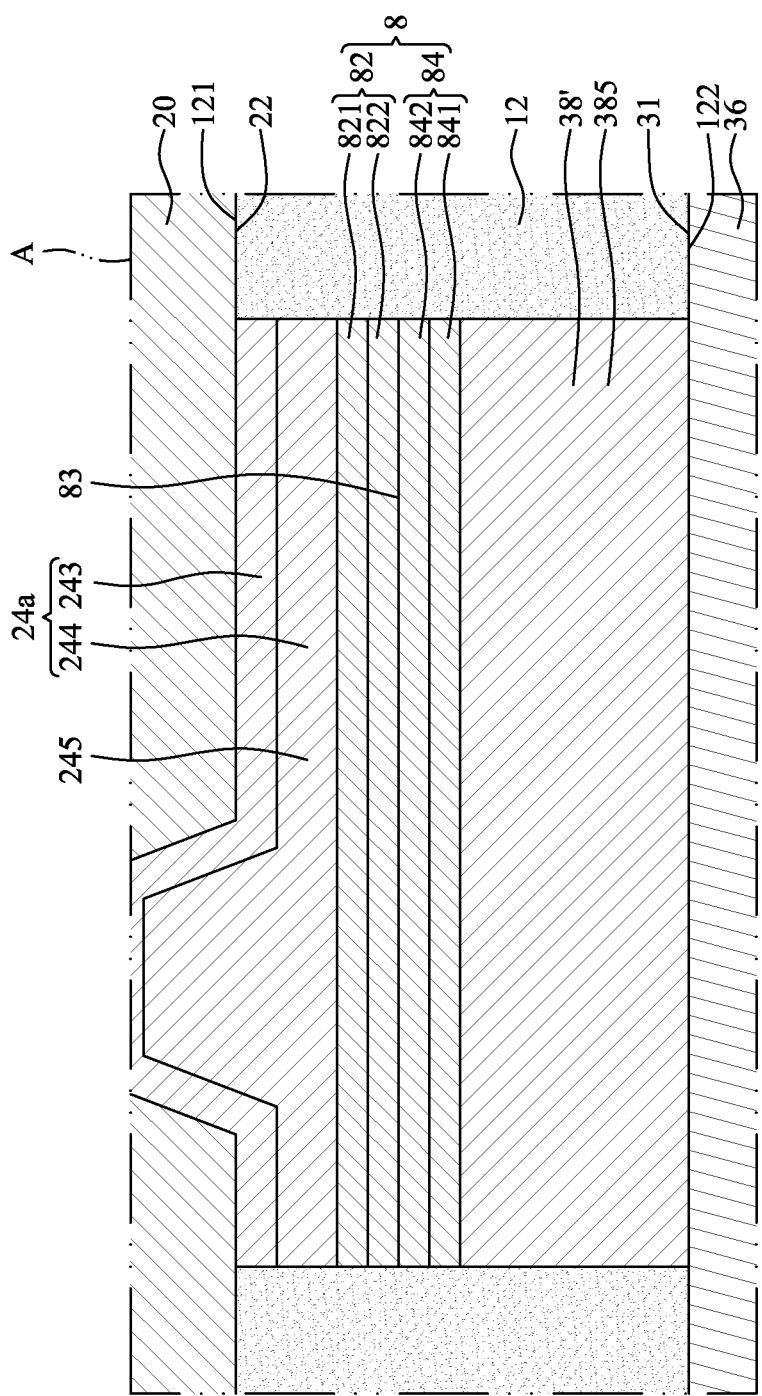
FIG. 1A illustrates an enlarged view of an area "A" shown in FIG. 1.

FIG. 1 illustrates a cross-sectional view of a wiring structure 1 according to some embodiments of the present disclosure. FIG. 1A illustrates an enlarged view of an area "A" shown in FIG. 1. The wiring structure 1 includes an upper conductive structure 2, a lower conductive structure 3, an intermediate layer 12 and a plurality of metallic structures 8.

The upper conductive structure 2 includes at least one dielectric layer (including, for example, two first dielectric layers 20 and a second dielectric layer 26) and at least one circuit layer (including, for example, two first circuit layers 24, a bottommost circuit layer 24a and a second circuit layer 28 formed of a metal, a metal alloy, or other conductive material) in contact with the dielectric layer (e.g., the first dielectric layers 20 and the second dielectric layer 26). In some embodiments, the upper conductive structure 2 may be similar to a coreless substrate, and may be in a wafer type, a panel type or a strip type. The upper conductive structure 2 may be also referred to as "a stacked structure" or "a high-density conductive structure" or "a high-density stacked structure". The circuit layer (including, for example, the two circuit layers 24) of the upper conductive structure 2 may be also referred to as "a high-density circuit layer". In some embodiments, a density of a circuit line (including, for example, a trace or a pad) of the high-density circuit layer is greater than a density of a circuit line of a low-density circuit layer. That is, the count of the circuit line (including, for example, a trace or a pad) in a unit area of the high-density circuit layer is greater than the count of the circuit line in an equal unit area of the low-density circuit layer, such as about 1.2 times or greater, about 1.5 times or greater, or about 2 times or greater. Alternatively, or in combination, a line width/line space (L/S) of the high-density circuit layer is less than a L/S of the low-density circuit layer, such as about 90% or less, about 50% or less, or about 20% or less. Further, the conductive structure that includes the high-density circuit layer may be designated as the "high-density conductive structure", and the conductive structure that includes the low-density circuit layer may be designated as a "low-density conductive structure".

The upper conductive structure 2 has a top surface 21 and a bottom surface 22 opposite to the top surface 21. The upper conductive structure 2 includes a plurality of dielectric layers (e.g., the two first dielectric layers 20 and the second dielectric layer 26), a plurality of circuit layers (e.g., the two first circuit layers 24, the bottommost circuit layer 24a and the second circuit layer 28) and at least one inner via 25. The dielectric layers (e.g., the first dielectric layers 20 and the second dielectric layer 26) are stacked on one another. For example, the second dielectric layer 26 is disposed on the first dielectric layers 20, and, thus, the second dielectric layer 26 is the topmost dielectric layer. In some embodiments, a material of the dielectric layers (e.g., the first dielectric layers 20 and the second dielectric layer 26) is transparent, and can be seen through by human eyes or machine. That is, a mark disposed adjacent to the bottom surface 22 of the upper conductive structure 2 can be recognized or detected from the top surface 21 of the upper conductive structure 2 by human eyes or machine. In some embodiments, a transparent material of the dielectric layers has a light transmission for a wavelength in the visible range (or other pertinent wavelength for detection of a mark) of at least about 60%, at least about 70%, or at least about 80%.

In addition, each of the first dielectric layers 20 has a top surface 201 and a bottom surface 202 opposite to the top surface 201. The second dielectric layer 26 has a top surface 261 and a bottom surface 262 opposite to the top surface 261. The bottom surface 262 of the second dielectric layer 26 is disposed on and contacts the top surface 201 of the adjacent first dielectric layer 20. Thus, the top surface 21 of the upper conductive structure 2 is the top surface 261 of the second dielectric layer 26, and the bottom surface 22 of the upper conductive structure 2 is the bottom surface 202 of the bottommost first dielectric layer 20. The first dielectric layers 20 and the second dielectric layer 26 may include, or be formed from, a photoresist layer, a cured photosensitive material, a cured photoimageable dielectric (PID) material such as a polyamide (PA), an Ajinomoto build-up film (ABF), a bismaleimide-triazine (BT), a polyimide (PI), epoxy or polybenzoxazole (PBO), or a combination of two or more thereof.

The first circuit layers 24 may be fan-out circuit layers or redistribution layers (RDLs), and an L/S of the first circuit layers 24 may be less than or equal to about 2 µm/about 2 or less than or equal to about 1.8 µm/about 1.8 Each of the first circuit layers 24 has a top surface 241 and a bottom surface 242 opposite to the top surface 241. In some embodiments, the first circuit layer 24 is embedded in the corresponding first dielectric layer 20, and the top surface 241 of the first circuit layer 24 may be substantially coplanar with the top surface 201 of the first dielectric layer 20. In some embodiments, each first circuit layer 24 may include a seed layer 243 and a conductive metallic material 244 disposed on the seed layer 243. As shown in FIG. 1, the bottommost circuit layer 24a is disposed on and protrudes from the bottom surface 22 of the upper conductive structure 2 (e.g., the bottom surface 202 of the bottommost first dielectric layer 20). An L/S of the bottommost circuit layer 24a may be greater than or equal to the L/S of the first circuit layer 24. In some embodiments, the bottommost circuit layer 24a may include a plurality of traces and a plurality of pads 245. However, in other embodiments, the bottommost circuit layer 24a may solely include the pads 245. In addition, the second circuit layer 28 is disposed on and protrudes from the top surface 21 of the upper conductive structure 2 (e.g., the top surface 261 of the second dielectric layer 26). An L/S of the second circuit layer 28 may be greater than or equal to the L/S of the first circuit layer 24. As illustrated in the embodiment of FIG. 1, a horizontally connecting or extending circuit layer is omitted in the second dielectric layer 26.

The upper conductive structure 2 further includes a plurality of inner vias 25. Some of the inner vias 25 are disposed between two adjacent first circuit layers 24 for electrically connecting the two first circuit layers 24. Some of the inner vias 25 are disposed between the first circuit layer 24 and the second circuit layer 28 for electrically connecting the first circuit layer 24 and the second circuit layer 28. Some of the inner vias 25 are disposed between the first circuit layer 24 and the bottommost circuit layer 24a for electrically connecting the first circuit layer 24 and the bottommost circuit layer 24a. In some embodiments, each inner via 25 may include a seed layer 251 and a conductive metallic material 252 disposed on the seed layer 251. In some embodiments, each inner via 25 and the corresponding first circuit layer 24 may be formed integrally as a monolithic or one-piece structure. Each inner via 25 tapers upwardly along a direction from the bottom surface 22 towards the top surface 21 of the upper conductive structure 2. That is, a size (e.g., a width) of a top portion of the inner via 25 is less than a size (e.g., a width) of a bottom portion of the inner via 25 that is closer towards the bottom surface 22. In some embodiments, a maximum width of the inner via 25 (e.g., at the bottom portion) may be less than or equal to about 25 µm, such as about 25 µm, about 20 µm about 15 µm or about 10 µm.

The lower conductive structure 3 includes at least one dielectric layer (including, for example, one first upper dielectric layer 30, one second upper dielectric layer 36, one first lower dielectric layer 30a and one second lower dielectric layer 36a) and at least one circuit layer (including, for example, one first upper circuit layer 34, two second upper circuit layers 38, 38', one first lower circuit layer 34a and two second lower circuit layers 38a, 38a' formed of a metal, a metal alloy, or other conductive material) in contact with the dielectric layer (e.g., the first upper dielectric layer 30, the second upper dielectric layer 36, the first lower dielectric layer 30a and the second lower dielectric layer 36a). In some embodiments, the lower conductive structure 3 may be similar to a core substrate that further includes a core portion 37, and may be in a wafer type, a panel type or a strip type. The lower conductive structure 3 may be also referred to as "a stacked structure" or "a low-density conductive structure" or "a low-density stacked structure". The circuit layer (including, for example, the first upper circuit layer 34, the two second upper circuit layers 38, 38', the first lower circuit layer 34a and the two second lower circuit layers 38a, 38a') of the lower conductive structure 3 may be also referred to as "a low-density circuit layer". As shown in FIG. 1, the lower conductive structure 3 has a top surface 31 and a bottom surface 32 opposite to the top surface 31. The lower conductive structure 3 includes a plurality of dielectric layers (for example, the first upper dielectric layer 30, the second upper dielectric layer 36, the first lower dielectric layer 30a and the second lower dielectric layer 36a), a plurality of circuit layers (for example, the first upper circuit layer 34, the two second upper circuit layers 38, 38', the first lower circuit layer 34a and the two second lower circuit layers 38a, 38a') and at least one inner via (including, for example, a plurality of upper interconnection vias 35 and a plurality of lower interconnection vias 35a).

The core portion 37 has a top surface 371 and a bottom surface 372 opposite to the top surface 371, and defines a plurality of through holes 373 extending through the core portion 37. An interconnection via 39 is disposed or formed in each through hole 373 for vertical connection. In some embodiments, each interconnection via 39 includes a base metallic layer 391 and an insulation material 392. The base metallic layer 391 is disposed or formed on a side wall of the through hole 373, and defines a central through hole. The insulation material 392 fills the central through hole defined by the base metallic layer 391. In some embodiments, the interconnection via 39 may omit an insulation material, and may include a bulk metallic material that fills the through hole 373.

The first upper dielectric layer 30 is disposed on the top surface 371 of the core portion 37, and has a top surface 301 and a bottom surface 302 opposite to the top surface 301. Thus, the bottom surface 302 of the first upper dielectric layer 30 contacts the top surface 371 of the core portion 37. The second upper dielectric layer 36 is stacked or disposed on the first upper dielectric layer 30, and has a top surface 361 and a bottom surface 362 opposite to the top surface 361. Thus, the bottom surface 362 of the second upper dielectric layer 36 contacts the top surface 301 of the first upper dielectric layer 30, and the second upper dielectric layer 36 is the topmost dielectric layer. In addition, the first lower dielectric layer 30a is disposed on the bottom surface 372 of the core portion 37, and has a top surface 301a and a bottom surface 302a opposite to the top surface 301a. Thus, the top surface 301a of the first lower dielectric layer 30a contacts the bottom surface 372 of the core portion 37. The second lower dielectric layer 36a is stacked or disposed on the first lower dielectric layer 30a, and has a top surface 361a and a bottom surface 362a opposite to the top surface 361a. Thus, the top surface 361a of the second lower dielectric layer 36a contacts the bottom surface 302a of the first lower dielectric layer 30a, and the second lower dielectric layer 36a is the bottommost dielectric layer. As shown in FIG. 1, the top surface 31 of the lower conductive structure 3 is the top surface 361 of the second upper dielectric layer 36, and the bottom surface 32 of the lower conductive structure 3 is the bottom surface 362a of the second lower dielectric layer 36a. The first upper dielectric layer 30, the second upper dielectric layer 36, the first lower dielectric layer 30a and the second lower dielectric layer 36a may include, or be formed from, a photoresist layer, a cured photosensitive material, a cured photoimageable dielectric (PID) material such as a polyamide (PA), an Ajinomoto build-up film (ABF), a bismaleimide-triazine (BT), a polyimide (PI), epoxy or polybenzoxazole (PBO), or a combination of two or more thereof.

A thickness of each of the dielectric layers (e.g., the first dielectric layers 20 and the second dielectric layer 26) of the upper conductive structure 2 is less than or equal to about 40%, less than or equal to about 35%, less than or equal to about 30% of a thickness of each of the dielectric layers (e.g., the first upper dielectric layer 30, the second upper dielectric layer 36, the first lower dielectric layer 30a and the second lower dielectric layer 36a) of the lower conductive structure 3. For example, a thickness of each of the dielectric layers (e.g., the first dielectric layers 20 and the second dielectric layer 26) of the upper conductive structure 2 may be less than or equal to about 7 μm, and a thickness of each of the dielectric layers (e.g., the first upper dielectric layer 30, the second upper dielectric layer 36, the first lower dielectric layer 30a and the second lower dielectric layer 36a) of the lower conductive structure 3 may be about 40 μm.

An L/S of the first upper circuit layer 34 may be greater than or equal to about 10 μm/about 10 μm. Thus, the L/S of the first upper circuit layer 34 may be greater than or equal to about five times the L/S of the first circuit layers 24 of the upper conductive structure 2. The first upper circuit layer 34 has a top surface 341 and a bottom surface 342 opposite to the top surface 341. In some embodiments, the first upper circuit layer 34 is formed or disposed on the top surface 371 of the core portion 37, and covered by the first upper dielectric layer 30. The bottom surface 342 of the first upper circuit layer 34 contacts the top surface 371 of the core portion 37. In some embodiments, the first upper circuit layer 34 may include a first metallic layer 343, a second metallic layer 344 and a third metallic layer 345. The first metallic layer 343 is disposed on the top surface 371 of the core portion 37, and may be formed from a copper foil (e.g., may constitute a portion of the copper foil). The second metallic layer 344 is disposed on the first metallic layer 343, and may be a plated copper layer. The third metallic layer 345 is disposed on the second metallic layer 344, and may be another plated copper layer. In some embodiments, the third metallic layer 345 may be omitted.

An L/S of the second upper circuit layer 38 may be greater than or equal to about 10 μm/about 10 μm. Thus, the L/S of the second upper circuit layer 38 may be substantially equal to the L/S of the first upper circuit layer 34, and may be greater than or equal to about five times the L/S of the first circuit layers 24 of the upper conductive structure 2. The second upper circuit layer 38 has a top surface 381 and a bottom surface 382 opposite to the top surface 381. In some embodiments, the second upper circuit layer 38 is formed or disposed on the top surface 301 of the first upper dielectric layer 30, and covered by the second upper dielectric layer 36. The bottom surface 382 of the second upper circuit layer 38 contacts the top surface 301 of the first upper dielectric layer 30. In some embodiments, the second upper circuit layer 38 is electrically connected to the first upper circuit layer 34 through the upper interconnection vias 35. In some embodiments, the second upper circuit layer 38 and the upper interconnection vias 35 are formed integrally as a monolithic or one-piece structure. Each upper interconnection via 35 tapers downwardly along a direction from the top surface 31 towards the bottom surface 32 of the lower conductive structure 3.

In addition, in some embodiments, the second upper circuit layer 38' is disposed on and protrudes from the top surface 361 of the second upper dielectric layer 36. In some embodiments, the second upper circuit layer 38 is electrically connected to the second upper circuit layer 38' through the upper interconnection vias 35. As shown in FIG. 1, the second upper circuit layer 38' is the topmost circuit layer of the lower conductive structure 3, and may include a plurality of traces and a plurality of pads 385. However, in other embodiments, the second upper circuit layer 38' may solely include the pads 385. In some embodiments, a size and a spacing of the pads 385 of the second upper circuit layer 38' of the lower conductive structure 3 is substantially equal to a size and a spacing of the pads 245 of the bottommost circuit layer 24a of the upper conductive structure 2. In addition, a position of each of the pads 385 of the second upper circuit layer 38' of the lower conductive structure 3 corresponds to a position of each of the pads 245 of the bottommost circuit layer 24a of the upper conductive structure 2. That is, each of the pads 245 of the bottommost circuit layer 24a of the upper conductive structure 2 is disposed right above and aligned with each of the pads 385 of the second upper circuit layer 38' of the lower conductive structure 3.

An L/S of the first lower circuit layer 34a may be greater than or equal to about 10 μm/about 10 μm. Thus, the L/S of the first lower circuit layer 34a may be greater than or equal to about five times the L/S of the first circuit layers 24 of the upper conductive structure 2. The first lower circuit layer 34a has a top surface 341a and a bottom surface 342a opposite to the top surface 341a. In some embodiments, the first lower circuit layer 34a is formed or disposed on the bottom surface 372 of the core portion 37, and covered by the first lower dielectric layer 30a. The top surface 341a of the first lower circuit layer 34a contacts the bottom surface 372 of the core portion 37. In some embodiments, the first lower circuit layer 34a may include a first metallic layer 343a, a second metallic layer 344a and a third metallic layer 345a. The first metallic layer 343a is disposed on the bottom surface 372 of the core portion 37, and may be formed from a copper foil. The second metallic layer 344a is disposed on the first metallic layer 343a, and may be a plated copper layer. The third metallic layer 345a is disposed on the second metallic layer 344a, and may be another plated copper layer. In some embodiments, the third metallic layer 345a may be omitted.

An L/S of the second lower circuit layer 38a may be greater than or equal to about 10 μm/about 10 μm. Thus, the L/S of the second lower circuit layer 38a may be substantially equal to the L/S of the first upper circuit layer 34, and may be greater than or equal to about five times the L/S of the first circuit layers 24 of the upper conductive structure 2. The second lower circuit layer 38a has a top surface 381a and a bottom surface 382a opposite to the top surface 381a. In some embodiments, the second lower circuit layer 38a is formed or disposed on the bottom surface 302a of the first lower dielectric layer 30a, and covered by the second lower dielectric layer 36a. The top surface 381a of the second lower circuit layer 38a contacts the bottom surface 302a of the first lower dielectric layer 30a. In some embodiments, the second lower circuit layer 38a is electrically connected to the first lower circuit layer 34a through the lower interconnection vias 35a. The lower interconnection vias 35a tapers upwardly along a direction from the bottom surface 32 towards the top surface 31 of the lower conductive structure 3.

In addition, in some embodiments, the second lower circuit layer 38a' is disposed on and protrudes from the bottom surface 362a of the second lower dielectric layer 36a. In some embodiments, the second lower circuit layer 38a' is electrically connected to the second lower circuit layer 38a through the lower interconnection vias 35a.

In some embodiments, each interconnection via 39 electrically connects the first upper circuit layer 34 and the first lower circuit layer 34a. The base metallic layer 391 of the interconnection via 39, the second metallic layer 344 of the first upper circuit layer 34 and the second metallic layer 344a the first lower circuit layer 34a may be formed integrally and concurrently as a monolithic or one-piece structure.

Figure 2:
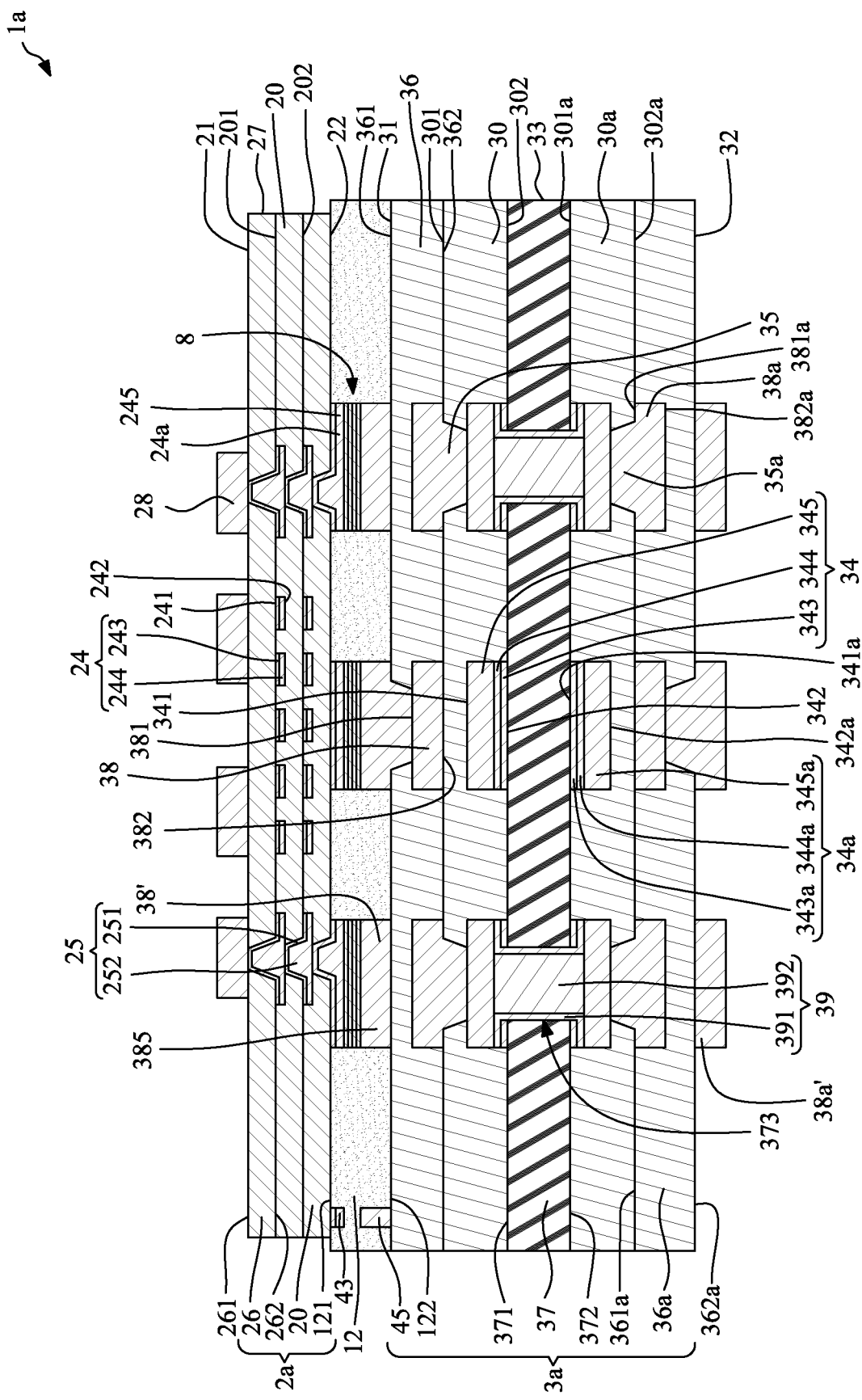
FIG. 2 illustrates a cross-sectional view of a wiring structure according to some embodiments of the present disclosure.

The metallic structures 8 are disposed between the upper conductive structure 2 and the lower conductive structure 3, and electrically connect the upper conductive structure 2 and the lower conductive structure 3. An upper end of each of the metallic structures 8 contacts a pad (e.g., the pads 245) of a circuit layer (e.g., the bottommost circuit layer 24a) of the upper conductive structure 2, and a lower end of each of the metallic structures 8 contacts a pad (e.g., the pads 385) of a circuit layer (e.g., the second upper circuit layer 38') of the lower conductive structure 3. In some embodiments, each of the metallic structures 8 is an electroless plating structures. That is, each of the metallic structures 8 is formed by electroless plating. As shown in FIG. 2, the metallic structure 8 includes an upper metallic portion 82 and a lower metallic portion 84, and has an interface 83 between the upper metallic portion 82 and the lower metallic portion 84. The upper metallic portion 82 is in contact with a circuit layer (such as the pad 245 of the bottommost circuit layer 24a) of the upper conductive structure 2. The lower metallic portion 84 is in contact with a circuit layer (such as the pads 385 of the second upper circuit layer 38') of the lower conductive structure 3. The metallic structure 8 is substantially symmetrical with respect to the interface 83. That is, the upper metallic portion 82 of the metallic structure 8 is substantially mirrored with or symmetrical with the lower metallic portion 84 of the metallic structure 8. Further, the upper metallic portion 82 of the metallic structure 8 is in contact with the lower metallic portion 84 of the metallic structure 8 at the interface 83. In some embodiments, the upper metallic portion 82 of the metallic structure 8 may include a first upper layer 821 and a second upper layer 822. The first upper layer 821 is disposed on a circuit layer (such as the pad 245 of the bottommost circuit layer 24a) of the upper conductive structure 2, and the second upper layer 822 is disposed on the first upper layer 821. The lower metallic portion 84 of the metallic structure 8 may include a first lower layer 841 and a second lower layer 842. The first lower layer 841 is disposed on a circuit layer (such as the pads 385 of the second upper circuit layer 38') of the lower conductive structure 3. A material of the first upper layer 821 is same as a material of the first lower layer 841, and a thickness of the first upper layer 821 is substantially equal to a thickness of the first lower layer 841. In some embodiments, the material of the first upper layer 821 and the first lower layer 841 both includes nickel. In addition, a material of the second upper layer 822 is same as a material of the second lower layer 842, and a thickness of the second upper layer 822 is substantially equal to a thickness of the second lower layer 842. In some embodiments, the material of the second upper layer 822 and the second lower layer 842 both includes palladium or gold. In addition, the first upper layer 821, the second upper layer 822, the first lower layer 841 and the second lower layer 842 are formed by electroless plating, thus, they are build-up metal layers.

As shown in FIG. 2, the second upper layer 822 is in contact with the second lower layer 842 at the interface 83. However, the second upper layer 822 and the second lower layer 842 may be formed integrally as a monolithic or one-piece structure, and the interface 83 may be omitted. Thus, the metallic structure 8 may include three layers. However, the three-layered metallic structure 8 may still be substantially symmetrical with respect to an imaginary center plane. In some embodiments, the metallic structure 8 may include six layers, that is, the upper metallic portion 82 may include three layers (e.g., a nickel layer, a palladium layer and a gold layer), and the lower metallic portion 84 may include three layers (e.g., a nickel layer, a palladium layer and a gold layer). However, the two gold layers may be formed integrally as a monolithic or one-piece structure, thus, the metallic structure 8 may include five layers.

In some embodiments, a thickness of the metallic structure 8 may be substantially equal to a thickness of a circuit layer (such as the first circuit layer 24 or the bottommost circuit layer 24a) of the upper conductive structure 2. For example, the thickness of the metallic structure 8 may be about 2 μm to about 3 and the thickness of the first circuit layer 24 or the bottommost circuit layer 24a of the upper conductive structure 2 may be about 2 μm to about 3 μm. In addition, a thickness of the circuit layer (such as the first circuit layer 24 or the bottommost circuit layer 24a) of the upper conductive structure 2 is less than or equal to about 40%, less than or equal to about 35%, less than or equal to about 30% of a thickness of the circuit layer (such as the first upper circuit layer 34, the second upper circuit layers 38, 38', the first lower circuit layer 34a and the second lower circuit layers 38a, 38a') of the lower conductive structure 3. For example, a thickness of the circuit layer (such as the first upper circuit layer 34, the second upper circuit layers 38, 38', the first lower circuit layer 34a and the second lower circuit layers 38a, 38a') of the lower conductive structure 3 may be about 12 μm to about 15 μm.

The intermediate layer 12 is interposed or disposed between the upper conductive structure 2 and the lower conductive structure 3, and covers the metallic structures 8. The intermediate layer 12 may bond the upper conductive structure 2 and the lower conductive structure 3 together. That is, the intermediate layer 12 adheres to the bottom surface 22 of the upper conductive structure 2 and the top surface 31 of the lower conductive structure 3. In some embodiments, the intermediate layer 12 may be an adhesion layer that is cured from an adhesive material (e.g., includes a cured adhesive material such as an adhesive polymeric material) or an underfill. The intermediate layer 12 has a top surface 121 and a bottom surface 122 opposite to the top surface 121. The top surface 121 of the intermediate layer 12 contacts the bottom surface 22 of the upper conductive structure 2, and the bottom surface 122 of the intermediate layer 12 contacts the top surface 31 of the lower conductive structure 3. Thus, the bottommost circuit layer 24a of the upper conductive structure 2 and the topmost circuit layer 38' (e.g., the second upper circuit layer 38') of the lower conductive structure 3 are embedded in the intermediate layer 12.

In some embodiments, a bonding force between two adjacent dielectric layers (e.g., two adjacent first dielectric layers 20) of the upper conductive structure 2 is greater than a bonding force between a dielectric layer (e.g., the bottommost first dielectric layers 20) of the upper conductive structure 2 and the intermediate layer 12. In some embodiments, a material of the intermediate layer 12 is transparent, and can be seen through by human eyes or machine. That is, a mark disposed adjacent to the top surface 31 of the lower conductive structure 3 can be recognized or detected from the top surface 21 of the upper conductive structure 2 by human eyes or machine. In some embodiments, the intermediate layer 12 is substantially free of reinforcement element such as glass fiber. That is, the intermediate layer 12 may include no reinforcement element such as glass fiber, and may solely include a homogeneous resin. Alternatively, the intermediate layer 12 may include very few reinforcement element such as glass fiber. In addition, a material of the intermediate layer 12 may include Ajinomoto build-up film (ABF).

As shown in the embodiment illustrated in FIG. 1 and FIG. 1A, the wiring structure 1 is a combination of the upper conductive structure 2 and the lower conductive structure 3, in which the first circuit layers 24 and the bottommost circuit layer 24a of the upper conductive structure 2 have fine pitch, high yield and low thickness; and the circuit layers (e.g., the first upper circuit layer 34, the second upper circuit layers 38, 38', the first lower circuit layer 34a and the second lower circuit layers 38a, 38a') of the lower conductive structure 3 have low manufacturing cost. Thus, the wiring structure 1 has an advantageous compromise of yield and manufacturing cost, and the wiring structure 1 has a relatively low thickness. In some embodiments, if a package has 10000 I/O counts, the wiring structure 1 includes two layers of the first circuit layers 24 and a layer of the bottommost circuit layer 24a of the upper conductive structure 2 and six layers of the circuit layers (e.g., the first upper circuit layer 34, the second upper circuit layers 38, 38', the first lower circuit layer 34a and the second lower circuit layers 38a, 38a') of the lower conductive structure 3. The manufacturing yield for one layer of the first circuit layers 24 and the bottommost circuit layer 24a of the upper conductive structure 2 may be 99%, and the manufacturing yield for one layer of the circuit layers (e.g., the first upper circuit layer 34, the second upper circuit layers 38, 38', the first lower circuit layer 34a and the second lower circuit layers 38a, 38a') of the lower conductive structure 3 may be 90%. Thus, the yield of the wiring structure 1 may be improved. In addition, the warpage of the upper conductive structure 2 and the warpage of the lower conductive structure 3 are separated and will not influence each other. In some embodiments, a warpage shape of the upper conductive structure 2 may be different from a warpage shape of the lower conductive structure 3. For example, the warpage shape of the upper conductive structure 2 may be a convex shape, and the warpage shape of the lower conductive structure 3 may be a concave shape. In some embodiments, the warpage shape of the upper conductive structure 2 may be the same as the warpage shape of the lower conductive structure 3; however, the warpage of the lower conductive structure 3 will not be accumulated onto the warpage of the upper conductive structure 2. Thus, the yield of the wiring structure 1 may be further improved.

In addition, during a manufacturing process, the lower conductive structure 3 and the upper conductive structure 2 may be tested individually before being bonded together. Therefore, known good lower conductive structure 3 and known good upper conductive structure 2 may be selectively bonded together. Bad (or unqualified) lower conductive structure 3 and bad (or unqualified) upper conductive structure 2 may be discarded. As a result, the yield of the wiring structure 1 may be further improved.

FIG. 2 illustrates a cross-sectional view of a wiring structure 1a according to some embodiments of the present disclosure. The wiring structure 1a is similar to the wiring structure 1 shown in FIG. 1, except for structures of an upper conductive structure 2a and a lower conductive structure 3a. As shown in FIG. 2, the upper conductive structure 2a and the lower conductive structure 3a are both strip structures. Thus, the wiring structure 1a is a strip structure. In some embodiments, the lower conductive structure 3a may be a panel structure that carries a plurality of strip upper conductive structures 2a. Thus, the wiring structure 1a is a panel structure. In addition, a lateral peripheral surface 27 of the upper conductive structure 2a is not coplanar with (e.g., is inwardly recessed from or otherwise displaced from) a lateral peripheral surface 33 of the lower conductive structure 3a. In some embodiments, during a manufacturing process, the lower conductive structure 3a and the upper conductive structure 2a may be both known good strip structures. Alternatively, the upper conductive structure 2a may be a known good strip structure, and the lower conductive structure 3a may be a known good panel structure. As a result, the yield of the wiring structure 1a may be further improved.

As shown in FIG. 2, the upper conductive structure 2a includes at least one fiducial mark 43 at a corner thereof, and the lower conductive structure 3a has at least one fiducial mark 45 at a corner thereof. The fiducial mark 43 of the upper conductive structure 2a is aligned with a fiducial mark 45 of the lower conductive structure 3a during a manufacturing process, so that the relative position of the upper conductive structure 2a and the lower conductive structure 3a is secured. In some embodiments, the fiducial mark 43 of the upper conductive structure 2a is disposed on and protrudes from the bottom surface 22 of the upper conductive structure 2a (e.g., the bottom surface 202 of the bottommost first dielectric layer 20). The fiducial mark 43 and the bottommost circuit layer 24a may be at, or part of, the same layer, and may be formed concurrently. Further, the fiducial mark 45 of the lower conductive structure 3a is disposed on and protrudes from the top surface 31 of the lower conductive structure 3a (e.g., the top surface 361 of the second upper dielectric layer 36). The fiducial mark 45 and the second upper circuit layer 38' may be at, or part of, the same layer, and may be formed concurrently.

Figure 2A:
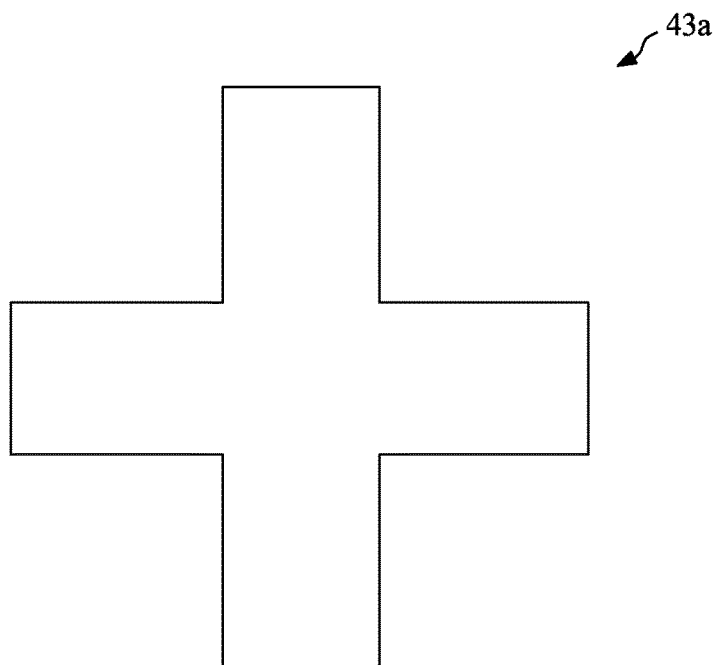
FIG. 2A illustrates a top view of an example of a fiducial mark of an upper conductive structure according to some embodiments of the present disclosure.

FIG. 2A illustrates a top view of an example of a fiducial mark 43a of the upper conductive structure 2a according to some embodiments of the present disclosure. The fiducial mark 43a of the upper conductive structure 2a has a continuous cross shape.

Figure 2B:
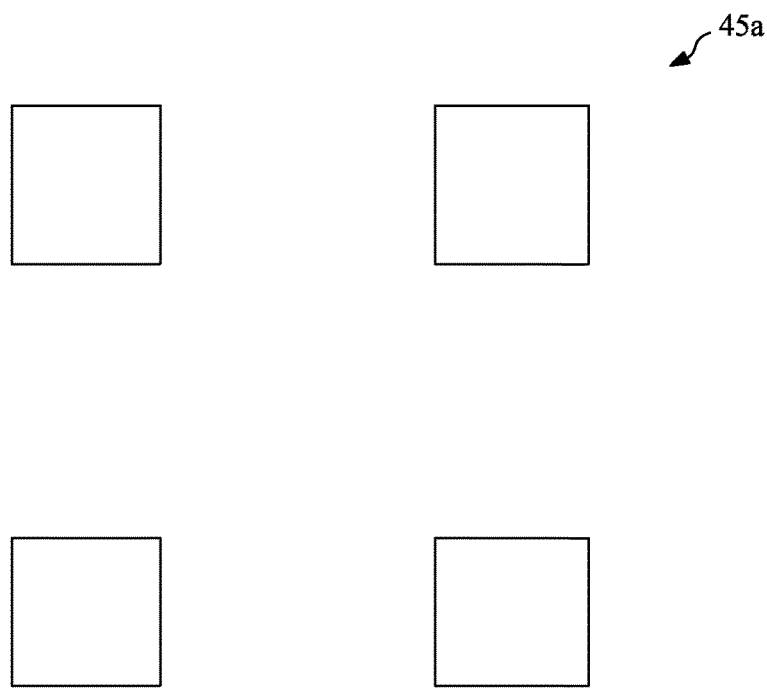
FIG. 2B illustrates a top view of an example of a fiducial mark of a lower conductive structure according to some embodiments of the present disclosure.

FIG. 2B illustrates a top view of an example of a fiducial mark 45a of the lower conductive structure 3a according to some embodiments of the present disclosure. The fiducial mark 45a of the lower conductive structure 3a includes four square-shaped segments spaced apart at four corners.

Figure 2C:
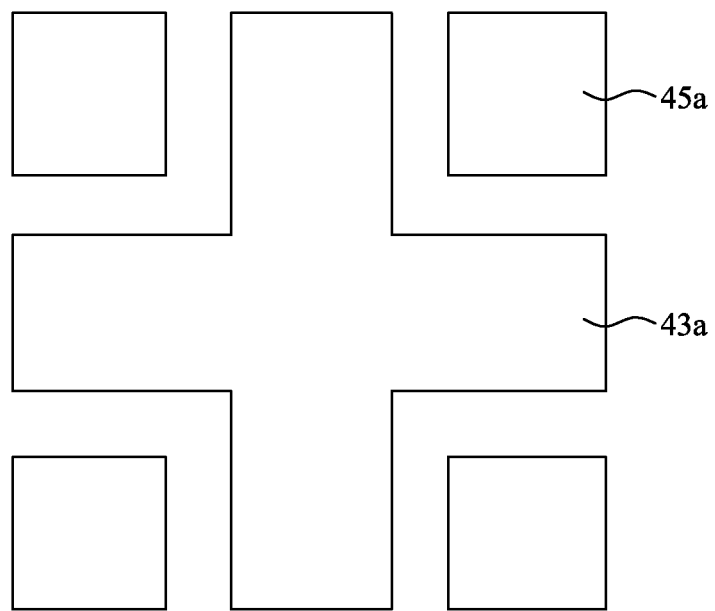
FIG. 2C illustrates a top view of a combination image of the fiducial mark of a upper conductive structure of FIG. 2A and the fiducial mark of the lower conductive structure of FIG. 2B.

FIG. 2C illustrates a top view of a combination image of the fiducial mark 43a of the upper conductive structure 2a of FIG. 2A and the fiducial mark 45a of the lower conductive structure 3a of FIG. 2B. When the upper conductive structure 2a is aligned with the lower conductive structure 3a precisely, the combination image shows the complete fiducial mark 43a and the complete fiducial mark 45a, as shown in FIG. 2C. That is, the fiducial mark 43a does not cover or overlap the fiducial mark 45a from the top view.

Figure 2D:
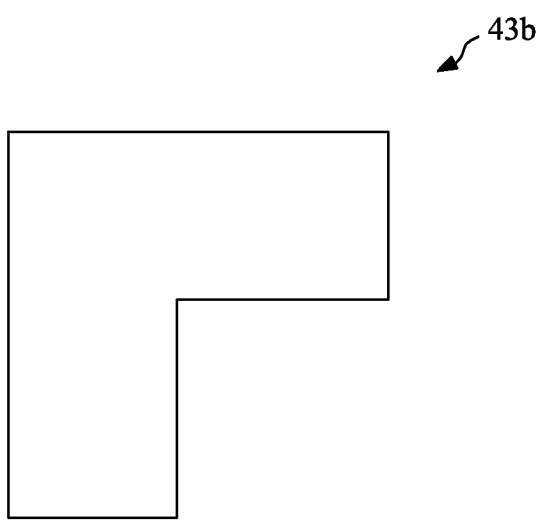
FIG. 2D illustrates a top view of an example of a fiducial mark of an upper conductive structure according to some embodiments of the present disclosure.

FIG. 2D illustrates a top view of an example of a fiducial mark 43b of the upper conductive structure 2a according to some embodiments of the present disclosure. The fiducial mark 43b of the upper conductive structure 2a has a continuous reversed "L" shape.

Figure 2E:
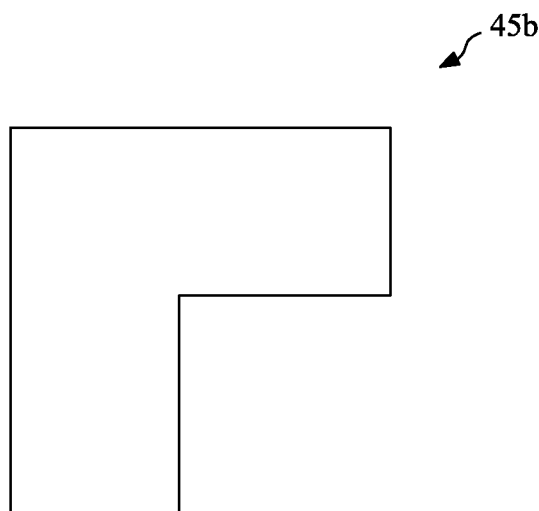
FIG. 2E illustrates a top view of an example of a fiducial mark of a lower conductive structure according to some embodiments of the present disclosure.

FIG. 2E illustrates a top view of an example of a fiducial mark 45b of the lower conductive structure 3a according to some embodiments of the present disclosure. The fiducial mark 45b of the lower conductive structure 3a has a continuous reversed "L" shape which is substantially the same as the fiducial mark 43b of the upper conductive structure 2a.

Figure 2F:
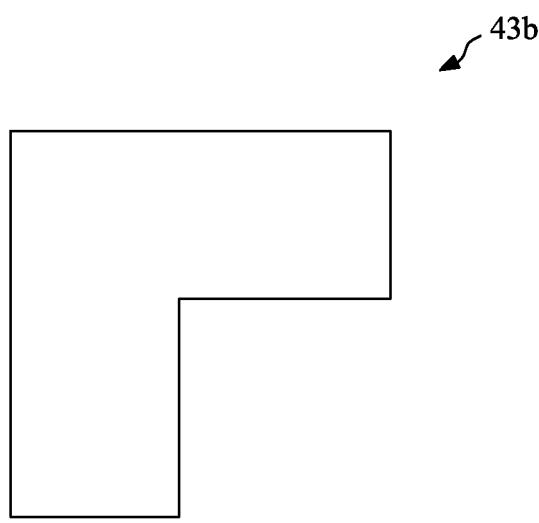
FIG. 2F illustrates a top view of a combination image of the fiducial mark of the upper conductive structure of FIG. 2D and the fiducial mark of the lower conductive structure of FIG. 2E.

FIG. 2F illustrates a top view of a combination image of the fiducial mark 43b of the upper conductive structure 2a of FIG. 2D and the fiducial mark 45b of the lower conductive structure 3a of FIG. 2E. When the upper conductive structure 2a is aligned with the lower conductive structure 3a precisely, the combination image shows solely the fiducial mark 43b of the upper conductive structure 2a, as shown in FIG. 2F. That is, the fiducial mark 43b completely covers or overlaps the fiducial mark 45b from the top view.

Figure 2G:
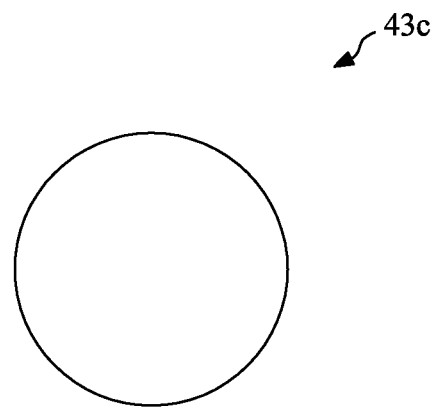
FIG. 2G illustrates a top view of an example of a fiducial mark of an upper conductive structure according to some embodiments of the present disclosure.

FIG. 2G illustrates a top view of an example of a fiducial mark 43c of the upper conductive structure 2a according to some embodiments of the present disclosure. The fiducial mark 43c of the upper conductive structure 2a has a continuous circular shape.

Figure 2H:
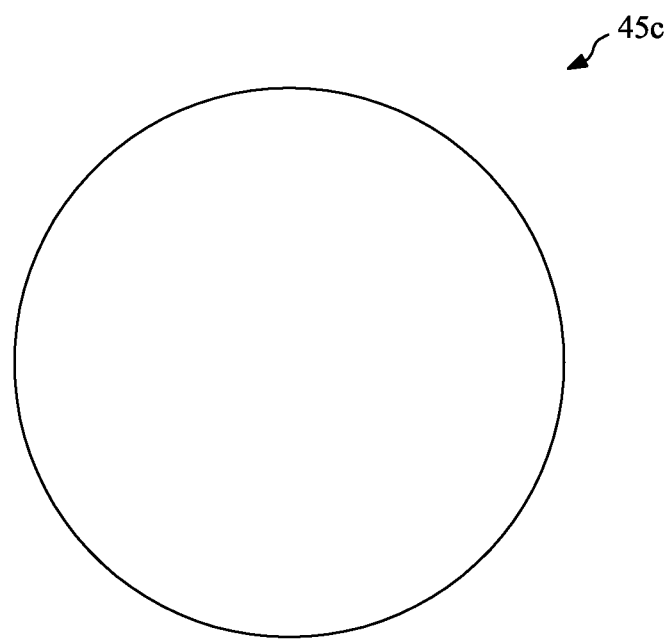
FIG. 2H illustrates a top view of an example of a fiducial mark of a lower conductive structure according to some embodiments of the present disclosure.

FIG. 2H illustrates a top view of an example of a fiducial mark 45c of the lower conductive structure 3a according to some embodiments of the present disclosure. The fiducial mark 45c of the lower conductive structure 3a has a continuous circular shape which is larger than the fiducial mark 43c of the upper conductive structure 2a.

Figure 2I:
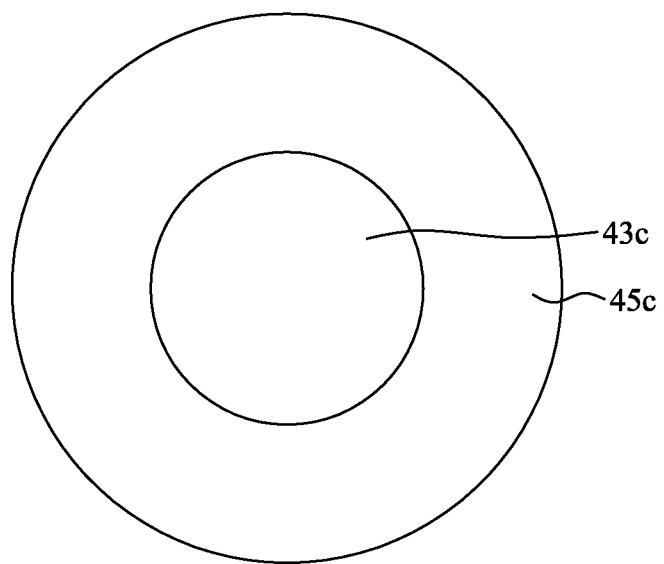
FIG. 2I illustrates a top view of a combination image of the fiducial mark of the upper conductive structure of FIG. 2G and the fiducial mark of the lower conductive structure of FIG. 2H.

FIG. 2I illustrates a top view of a combination image of the fiducial mark 43c of the upper conductive structure 2a of FIG. 2G and the fiducial mark 45c of the lower conductive structure 3a of FIG. 2H. When the upper conductive structure 2a is aligned with the lower conductive structure 3a precisely, the combination image shows two concentric circles, as shown in FIG. 2I. That is, the fiducial mark 43c is disposed at the center of the fiducial mark 45b.

Figure 3:
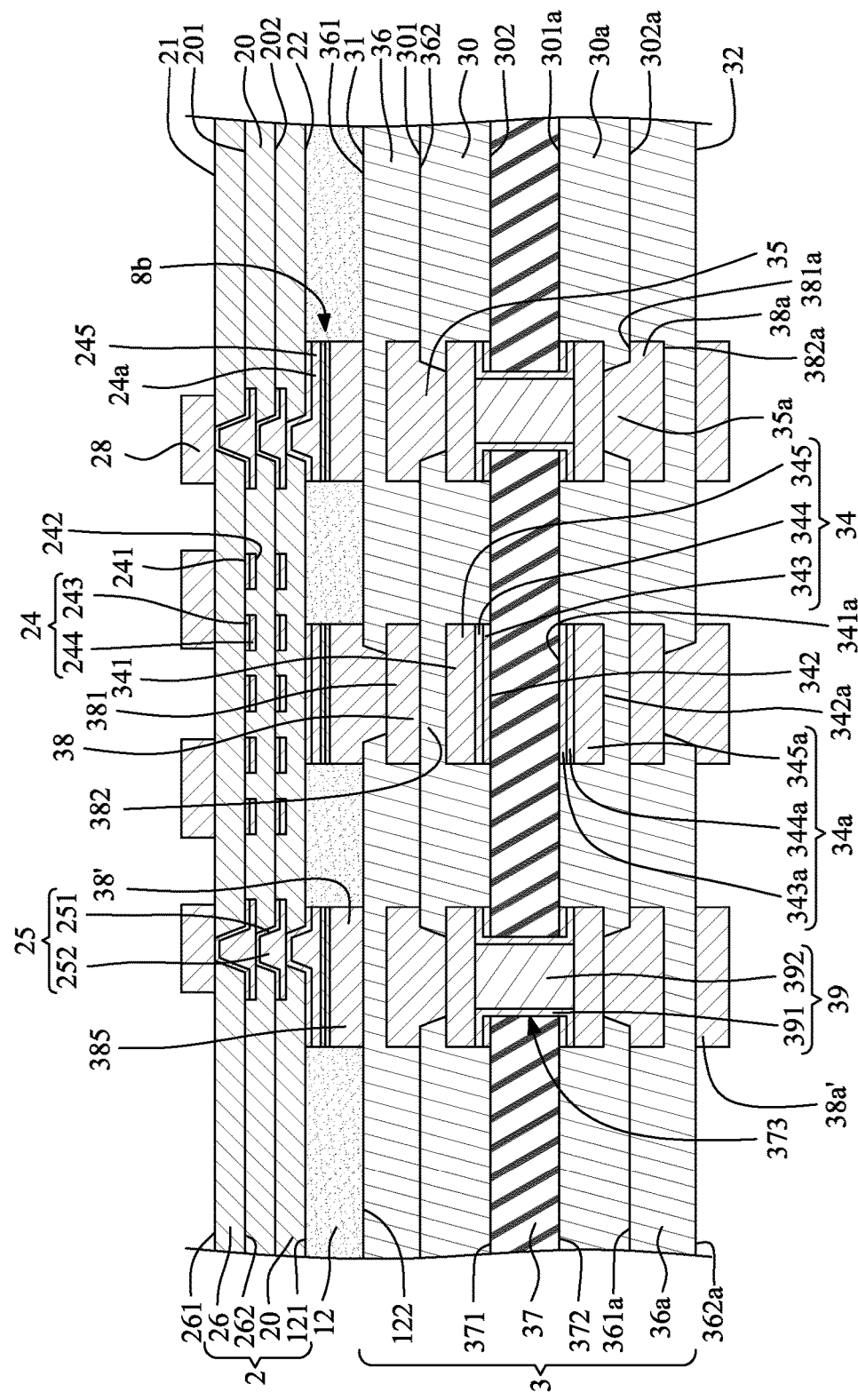
FIG. 3 illustrates a cross-sectional view of a wiring structure according to some embodiments of the present disclosure.

FIG. 3 illustrates a cross-sectional view of a wiring structure 1b according to some embodiments of the present disclosure. The wiring structure 1b is similar to the wiring structure 1 shown in FIG. 1, except for structures of the metallic structures 8b. As shown in FIG. 3, the metallic structure 8b may include second layers, that is, the upper metallic portion may include one layer (e.g., a nickel layer, a palladium layer or a gold layer), and the lower metallic portion may include one layer (e.g., a nickel layer, a palladium layer or a gold layer). However, the two layers may be formed integrally as a monolithic or one-piece structure, thus, the metallic structure 8 may solely include one layer.

Figure 4:
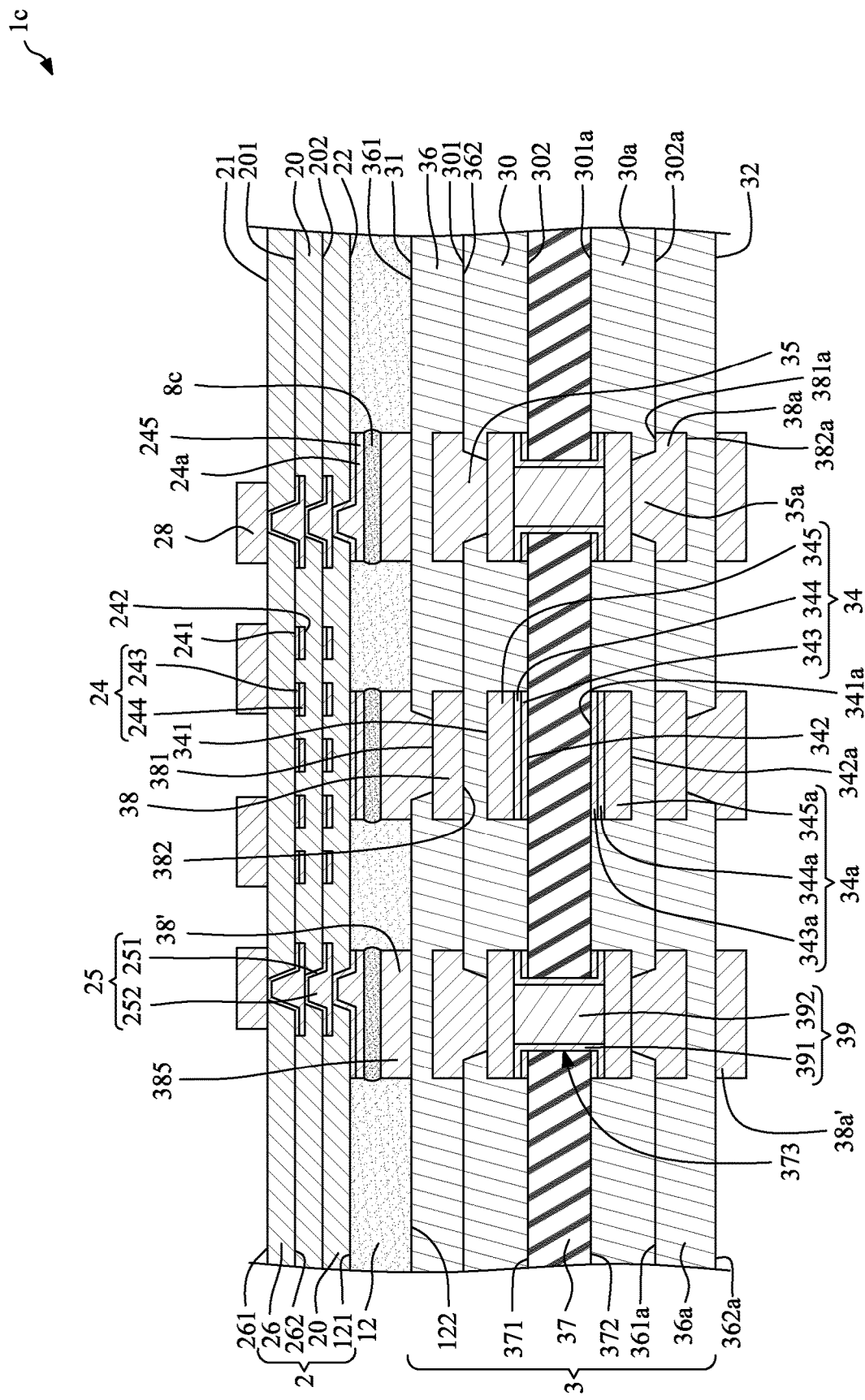
FIG. 4 illustrates a cross-sectional view of a wiring structure according to some embodiments of the present disclosure.

FIG. 4 illustrates a cross-sectional view of a wiring structure 1c according to some embodiments of the present disclosure. The wiring structure 1c is similar to the wiring structure 1 shown in FIG. 1, except that the metallic structure 8 is replaced by a solder material 8c. The solder material 8c is not formed by electroless plating, thus, it is not a build-up metal layer.

Figure 5:
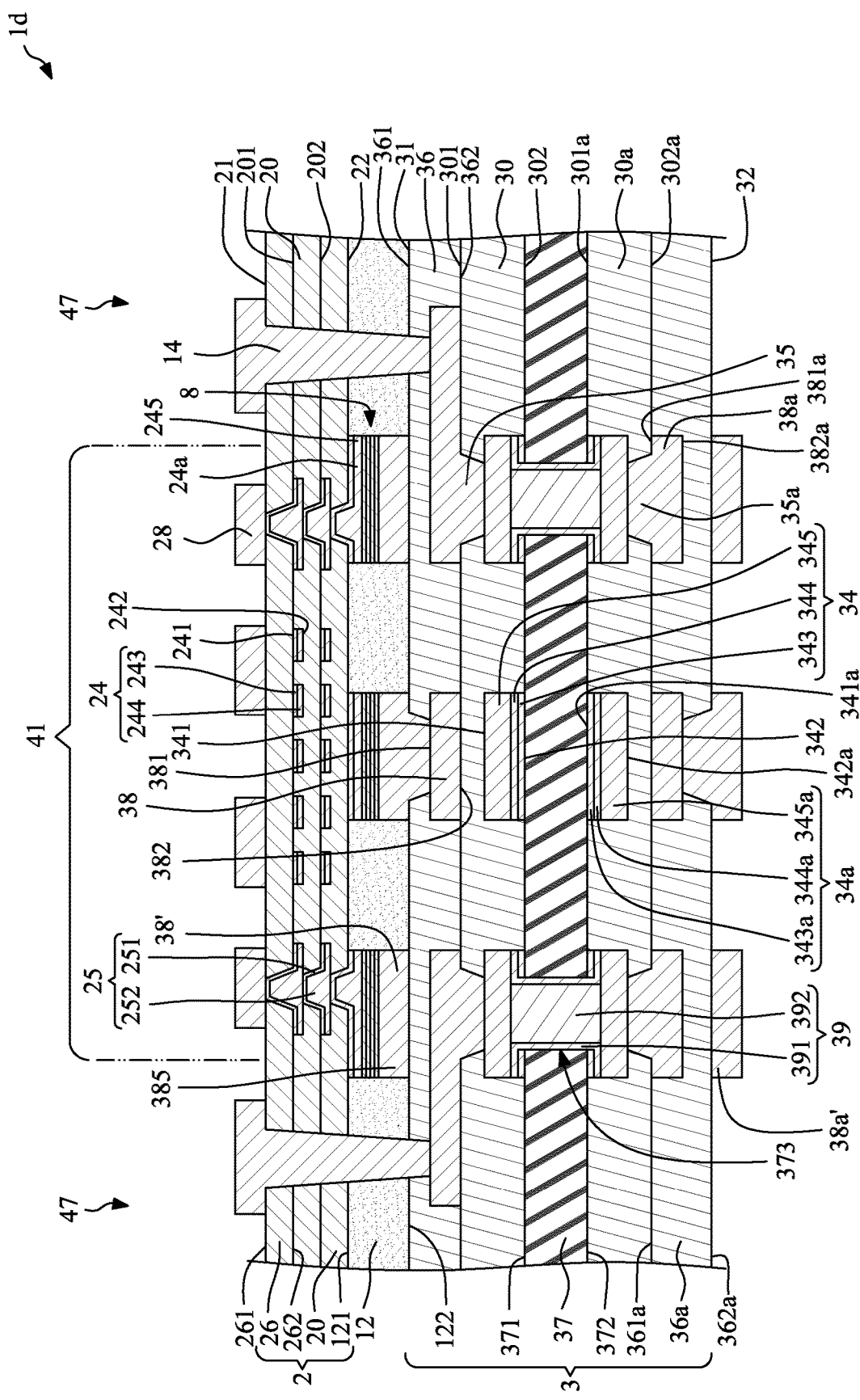
FIG. 5 illustrates a cross-sectional view of a wiring structure according to some embodiments of the present disclosure.

FIG. 5 illustrates a cross-sectional view of a wiring structure 1d according to some embodiments of the present disclosure. The wiring structure 1d is similar to the wiring structure 1 shown in FIG. 1, except that at least one conductive via 14 is further included. The conductive via 14 is formed of a metal, a metal alloy, or other conductive material, extends through the upper conductive structure 2 and the intermediate layer 12, and is electrically connected to the second upper circuit layer 38 of the lower conductive structure 3. A length (along a longitudinal axis) of the conductive via 14 is greater than a thickness of the high-density conductive structure (e.g., the upper conductive structure 2). Further, the conductive via 14 tapers downwardly. Thus, a tapering direction of the inner via 25 of the upper conductive structure 2 is different from a tapering direction of the conductive via 14. In some embodiments, the conductive via 14 is a monolithic structure or a one-piece structure having a homogeneous material composition, and a peripheral surface of the conductive via 14 is a substantially continuous surface without boundaries. The conductive via 14 and the second circuit layer 28 may be formed integrally as a monolithic or one-piece structure. In some embodiments, a maximum width of the conductive via 14 may be less than about 40 such as about 30 μm or about 20 In some embodiments, the conductive via 14 may extend through the lower conductive structure 3 or the wiring structure 1d to electrically connect the upper conductive structure 2 and the lower conductive structure 3.

As shown in FIG. 5, the upper conductive structure 2 includes a high-density region 41 and a low-density region 47. In some embodiments, a density of a circuit line (including, for example, a trace or a pad) in the high-density region 41 is greater than a density of a circuit line in the low-density region 47. That is, the count of the circuit line (including, for example, the trace or the pad) in a unit area within the high-density region 41 is greater than the count of the circuit line in an equal unit area within the low-density region 47. Further, the conductive via 14 is disposed in the low-density region 47 of the high-density conductive structure (e.g., the upper conductive structure 2). In some embodiments, the high-density region 41 may be a chip bonding area.

Figure 6:
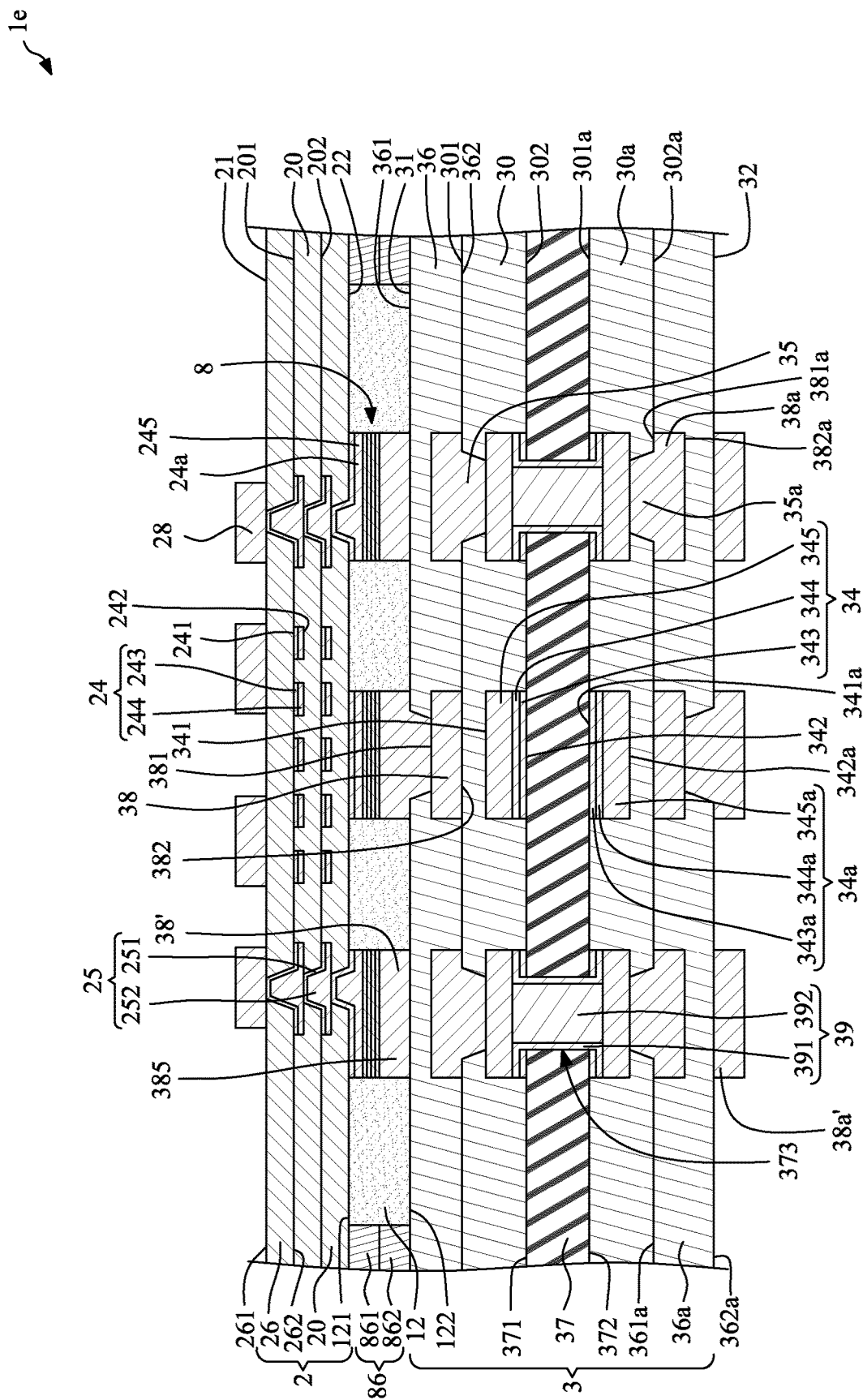
FIG. 6 illustrates a cross-sectional view of a wiring structure according to some embodiments of the present disclosure.

FIG. 6 illustrates a cross-sectional view of a wiring structure 1e according to some embodiments of the present disclosure. The wiring structure 1e is similar to the wiring structure 1 shown in FIG. 1, except that at least one dent structure 86 is further included. The dent structure 86 is disposed between the upper conductive structure 2 and the lower conductive structure 3. An upper end of the dent structure 86 contacts a dielectric layer (e.g., the first dielectric layer 20) of the upper conductive structure 2, and a lower end of the dent structure 86 contacts a dielectric layer (e.g., the second upper dielectric layer 36) of the lower conductive structure 3. A material of the dent structure 86 includes a polymer material (such as solder mask) rather than metal material. As shown in FIG. 6, the dent structure 86 includes an upper dent portion 861 and a lower dent portion 862. The upper dent portion 861 is disposed on the (e.g., the first dielectric layer 20) of the upper conductive structure 2, and the lower dent portion 862 is disposed on the dielectric layer (e.g., the second upper dielectric layer 36) of the lower conductive structure 3. The upper dent portion 861 is in contact with the lower dent portion 862. Thus, the upper dent portion 861 is adhered to the lower dent portion 862, and there may be a boundary between the upper dent portion 861 and the lower dent portion 862. In addition, the dent structure 86 is a standoff structure that provides the gap between a circuit layer (such as the pad 245 of the bottommost circuit layer 24a) of the upper conductive structure 2 and a circuit layer (such as the pads 385 of the second upper circuit layer 38') of the lower conductive structure 3 before the metallic structures 8 are formed.

Figure 7:
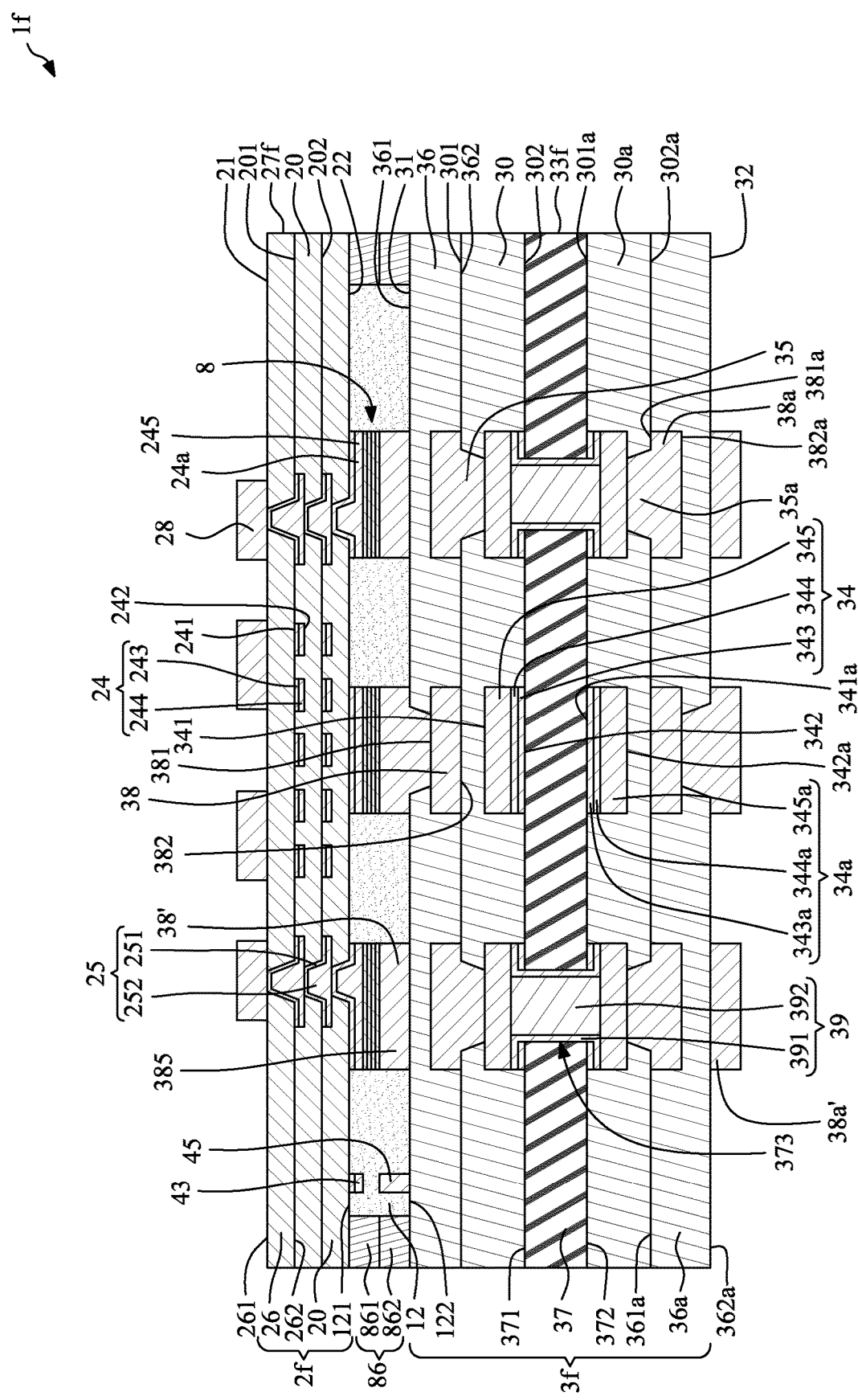
FIG. 7 illustrates a cross-sectional view of a bonding of a package structure and a substrate.

FIG. 7 illustrates a cross-sectional view of a wiring structure 1f according to some embodiments of the present disclosure. The wiring structure 1f is similar to the wiring structure 1a shown in FIG. 2, except for structures of an upper conductive structure 2f and a lower conductive structure 3f. The upper conductive structure 2f and the lower conductive structure 3f are both dice and may be singulated concurrently. Thus, the wiring structure 1f is a unit structure. That is, a lateral peripheral surface 27f of the upper conductive structure 2f and a lateral peripheral surface 33f of the lower conductive structure 3f are substantially coplanar with each other. In addition, at least one dent structure 86 is further included. The dent structure 86 is disposed between the upper conductive structure 2f and the lower conductive structure 3f. An upper end of the dent structure 86 contacts a dielectric layer (e.g., the first dielectric layer 20) of the upper conductive structure 2f, and a lower end of the dent structure 86 contacts a dielectric layer (e.g., the second upper dielectric layer 36) of the lower conductive structure 3f. As shown in FIG. 7, the dent structure 86 includes an upper dent portion 861 and a lower dent portion 862. The upper dent portion 861 is disposed on the (e.g., the first dielectric layer 20) of the upper conductive structure 2f, and the lower dent portion 862 is disposed on the dielectric layer (e.g., the second upper dielectric layer 36) of the lower conductive structure 3f. In addition, the dent structure 86 is a standoff structure that provides the gap between a circuit layer (such as the pad 245 of the bottommost circuit layer 24a) of the upper conductive structure 2f and a circuit layer (such as the pads 385 of the second upper circuit layer 38') of the lower conductive structure 3f before the metallic structures 8 are formed. It is noted that if the dent structure 86 and the fiducial marks 43, 45 are disposed within a saw street, they may be disregarded after a singulation process.

Figure 8:
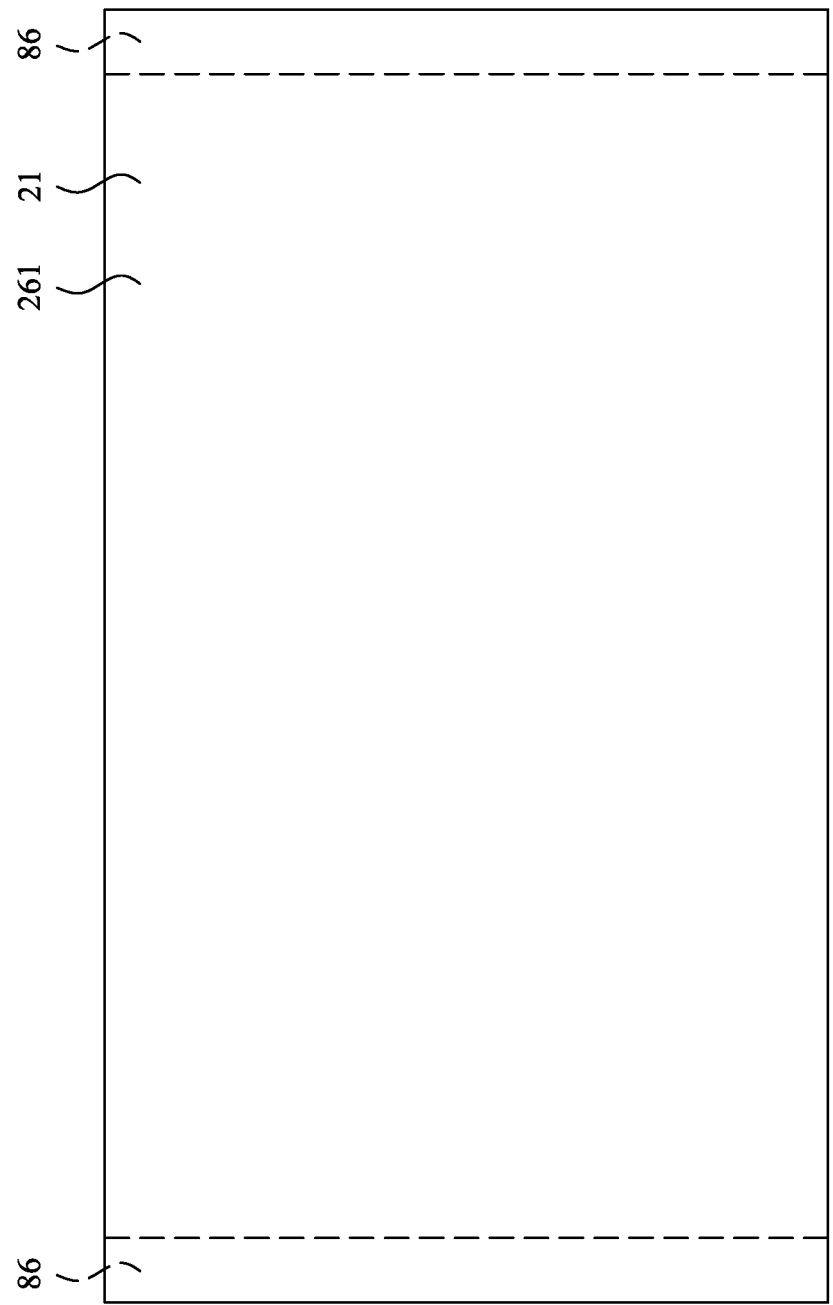
FIG. 8 illustrates a top view of the wiring structure of FIG. 7, wherein a second circuit layer of the upper conductive structure is omitted for the purpose of the clear explanation.

FIG. 8 illustrates a top view of the wiring structure 1f of FIG. 7, wherein a second circuit layer 28 of the upper conductive structure 2f is omitted for the purpose of the clear explanation. As shown in FIG. 8, the dent structures 86 are strip structures, and are disposed adjacent to two lateral peripheral surfaces respectively. As shown in FIG. 7, the lateral peripheral surface 27f of the upper conductive structure 2f, a lateral peripheral surface of the dent structures 86a and the lateral peripheral surface 33f of the lower conductive structure 3f are substantially coplanar with each other.

Figure 9:
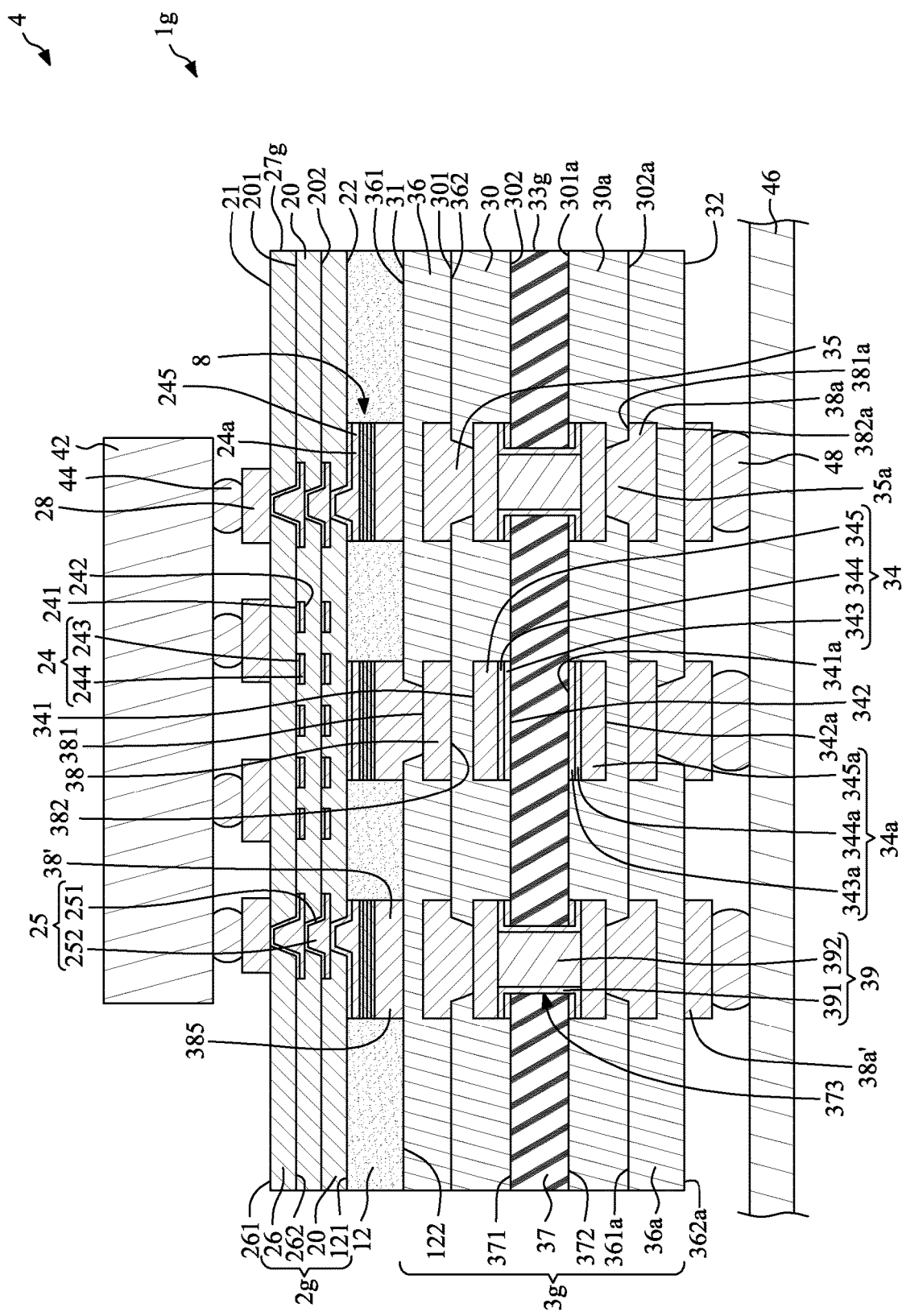
FIG. 9 illustrates a cross-sectional view of a wiring structure according to some embodiments of the present disclosure.

FIG. 9 illustrates a cross-sectional view of a bonding of a package structure 4 and a substrate 46 according to some embodiments. The package structure 4 includes a wiring structure 1g, a semiconductor chip 42, a plurality of first connecting elements 44 and a plurality of second connecting elements 48. The wiring structure 1g of FIG. 9 is similar to the wiring structure 1 shown in FIG. 1, except for structures of an upper conductive structure 2g and a lower conductive structure 3g. The upper conductive structure 2g and the lower conductive structure 3g are both dice and may be singulated concurrently. Thus, the wiring structure 1g is a unit structure. That is, a lateral peripheral surface 27g of the upper conductive structure 2g, a lateral peripheral surface 33g of the lower conductive structure 3g and a lateral peripheral surface of the intermediate layer 12 are substantially coplanar with each other. The semiconductor chip 42 is electrically connected and bonded to the second circuit layer 28 of the upper conductive structure 2g through the first connecting elements 44 (e.g., solder bumps or other conductive bumps). The second lower circuit layer 38a' of the lower conductive structure 3g is electrically connected and bonded to the substrate 46 (e.g., a mother board such as a printed circuit board (PCB)) through the second connecting elements 48 (e.g., solder bumps or other conductive bumps).

FIG. 10 through FIG. 35 illustrate a method for manufacturing a wiring structure according to some embodiments of the present disclosure. In some embodiments, the method is for manufacturing the wiring structure 1 shown in FIG. 1, the wiring structure 1e shown in FIG. 6 and/or the package structure 4 shown in FIG. 9.

Figure 10:
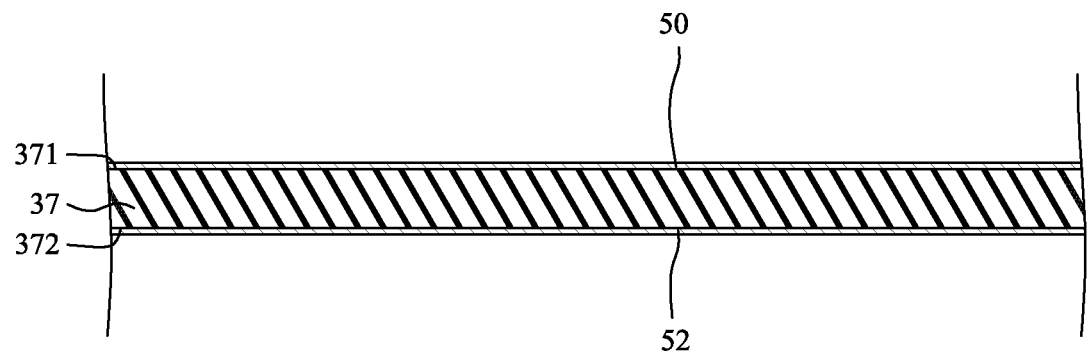
FIG. 10 illustrates one or more stages of an example of a method for manufacturing a wiring structure according to some embodiments of the present disclosure.

Referring to FIG. 10 through FIG. 21, a lower conductive structure 3 is provided. The lower conductive structure 3 is manufactured as follows. Referring to FIG. 10, a core portion 37 with a top copper foil 50 and a bottom copper foil 52 is provided. The core portion 37 may be in a wafer type, a panel type or a strip type. The core portion 37 has a top surface 371 and a bottom surface 372 opposite to the top surface 371. The top copper foil 50 is disposed on the top surface 371 of the core portion 37, and the bottom copper foil 52 is disposed on the bottom surface 372 of the core portion 37.

Figure 11:
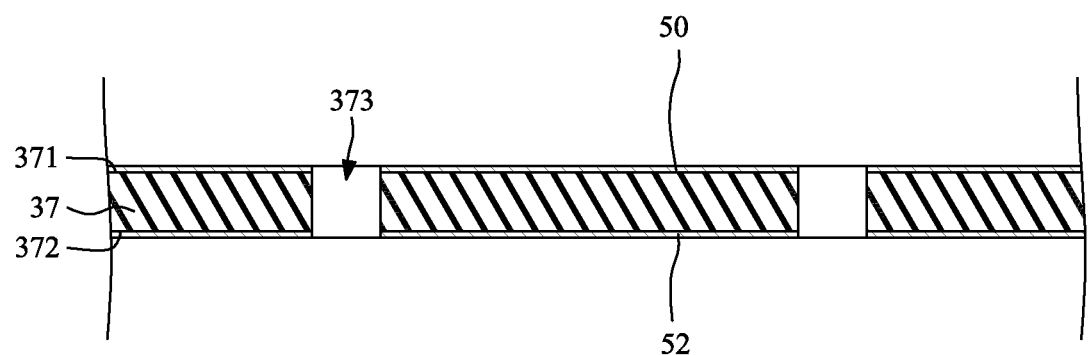
FIG. 11 illustrates one or more stages of an example of a method for manufacturing a wiring structure according to some embodiments of the present disclosure.

Referring to FIG. 11, a plurality of through holes 373 are formed to extend through the core portion 37, the top copper foil 50 and the bottom copper foil 52 by a drilling technique (such as laser drilling or mechanical drilling) or other suitable techniques.

Figure 12:
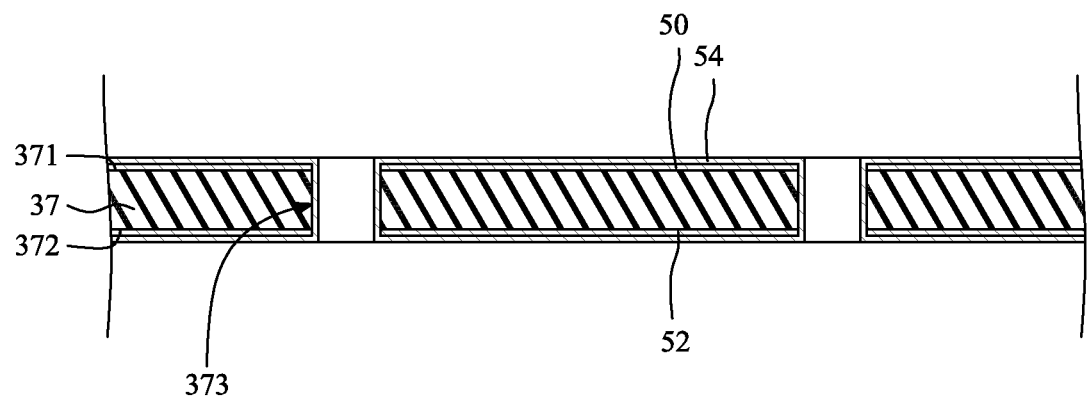
FIG. 12 illustrates one or more stages of an example of a method for manufacturing a wiring structure according to some embodiments of the present disclosure.

Referring to FIG. 12, a second metallic layer 54 is formed or disposed on the top copper foil 50, the bottom copper foil 52 and side walls of the first through holes 373 by a plating technique or other suitable techniques. A portion of the second metallic layer 54 on the side wall of each first through hole 373 defines a central through hole.

Figure 13:
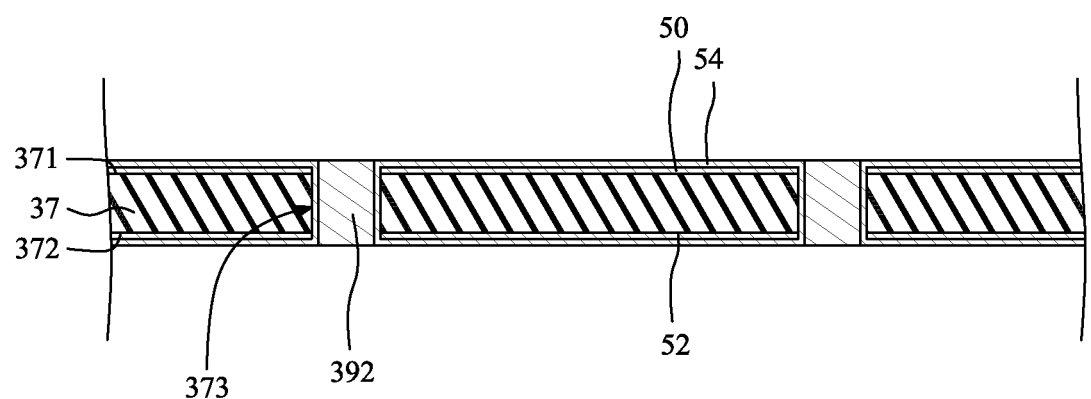
FIG. 13 illustrates one or more stages of an example of a method for manufacturing a wiring structure according to some embodiments of the present disclosure.

Referring to FIG. 13, an insulation material 392 is disposed to fill the central through hole defined by the second metallic layer 54.

Figure 14:
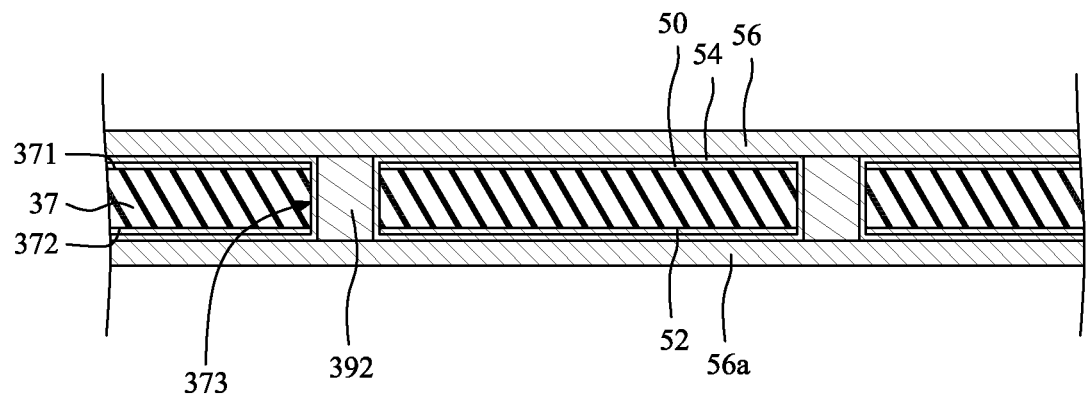
FIG. 14 illustrates one or more stages of an example of a method for manufacturing a wiring structure according to some embodiments of the present disclosure.

Referring to FIG. 14, a top third metallic layer 56 and a bottom third metallic layer 56a are formed or disposed on the second metallic layer 54 by a plating technique or other suitable techniques. The third metallic layers 56, 56a cover the insulation material 392.

Figure 15:
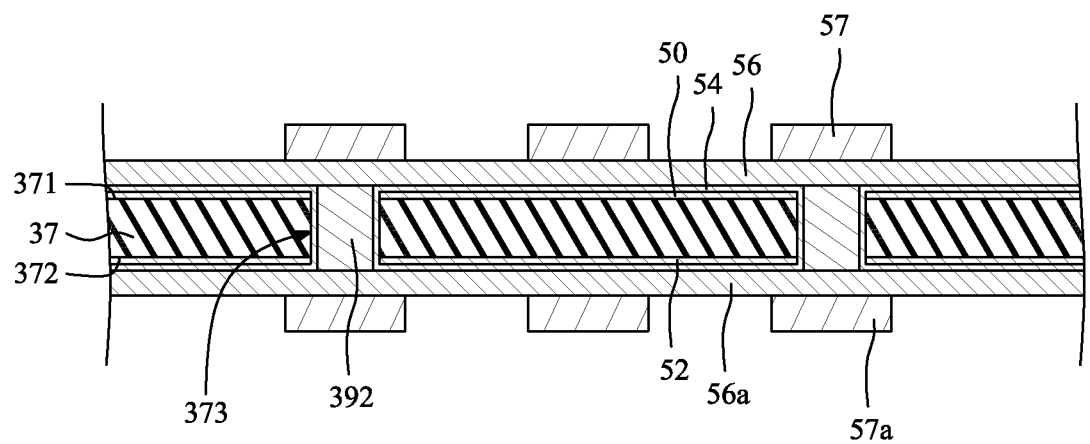
FIG. 15 illustrates one or more stages of an example of a method for manufacturing wiring structure according to some embodiments of the present disclosure.

Referring to FIG. 15, a top photoresist layer 57 is formed or disposed on the top third metallic layer 56, and a bottom photoresist layer 57a is formed or disposed on the bottom third metallic layer 56a. Then, the photoresist layers 57, 57a are patterned by exposure and development.

Figure 16:
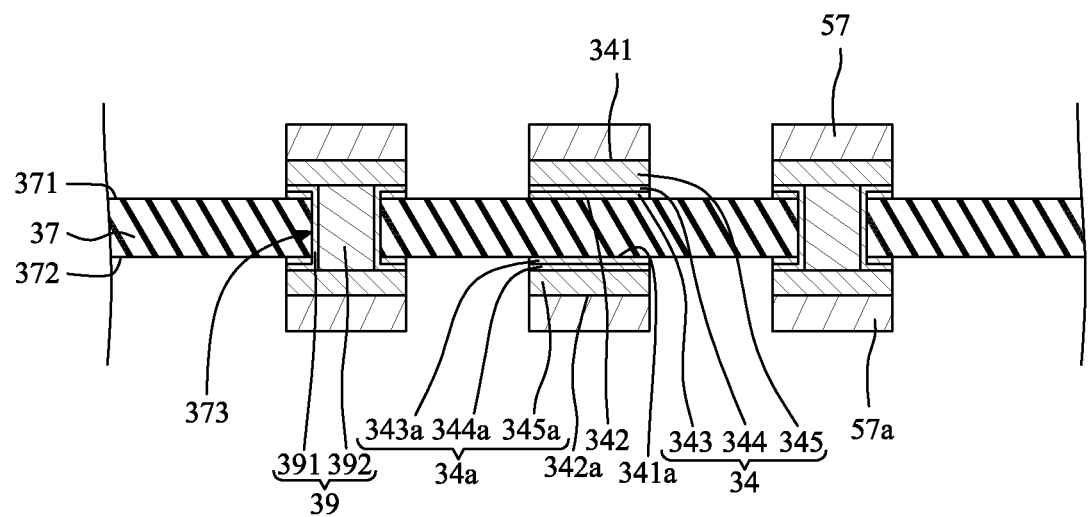
FIG. 16 illustrates one or more stages of an example of a method for manufacturing a wiring structure according to some embodiments of the present disclosure.

Referring to FIG. 16, portions of the top copper foil 50, the second metallic layer 54 and the top third metallic layer 56 that are not covered by the top photoresist layer 57 are removed by an etching technique or other suitable techniques. Portions of the top copper foil 50, the second metallic layer 54 and the top third metallic layer 56 that are covered by the top photoresist layer 57 remain to form a first upper circuit layer 34. Meanwhile, portions of the bottom copper foil 52, the second metallic layer 54 and the bottom third metallic layer 56a that are not covered by the bottom photoresist layer 57a are removed by an etching technique or other suitable techniques. Portions of the bottom copper foil 52, the second metallic layer 54 and the bottom third metallic layer 56a that are covered by the bottom photoresist layer 57a remain to form a first lower circuit layer 34a. Meanwhile, portions of the second metallic layer 54 and the insulation material 392 that are disposed in the through hole 373 form an interconnection via 39. In some embodiments, the first upper circuit layer 34 may include a first metallic layer 343, a second metallic layer 344 and a third metallic layer 345. The first metallic layer 343 is disposed on the top surface 371 of the core portion 37, and may be formed from a portion of the top copper foil 50. The second metallic layer 344 is disposed on the first metal layer 343, and may be a plated copper layer formed from the second metallic layer 54. The third metallic layer 345 is disposed on the second metallic layer 344, and may be another plated copper layer formed from the top third metallic layer 56.

In some embodiments, the first lower circuit layer 34*a* may include a first metallic layer 343*a*, a second metallic layer 344*a* and a third metallic layer 345*a*. The first metallic layer 343*a* is disposed on the bottom surface 372 of the core portion 37, and may be formed from a portion of the bottom copper foil 52. The second metallic layer 344*a* is disposed on the first metallic layer 343*a*, and may be a plated copper layer formed from the second metallic layer 54. The third metallic layer 345*a* is disposed on the second metallic layer 344*a*, and may be another plated copper layer formed from the bottom third metallic layer 56*a*. The interconnection via 39 includes a base metallic layer 391 formed from the second metallic layer 54 and the insulation material 392. In some embodiments, the interconnection via 39 may include a bulk metallic material that fills the through hole 373. The interconnection via 39 electrically connects the first upper circuit layer 34 and the first lower circuit layer 34*a*.

Figure 17:
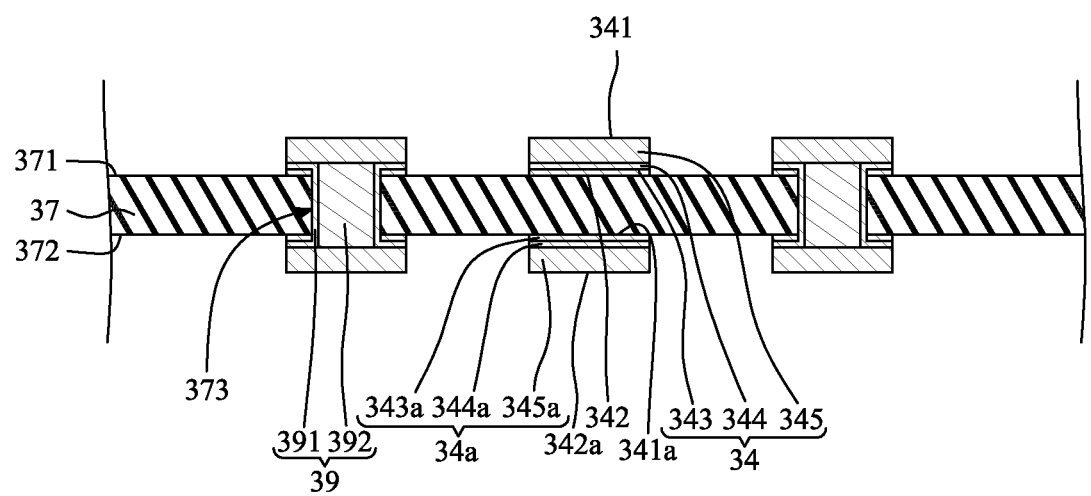
FIG. 17 illustrates one or more stages of an example of a method for manufacturing a wiring structure according to some embodiments of the present disclosure.

Referring to FIG. 17, the top photoresist layer 57 and the bottom photoresist layer 57*a* are removed by a stripping technique or other suitable techniques.

Figure 18:
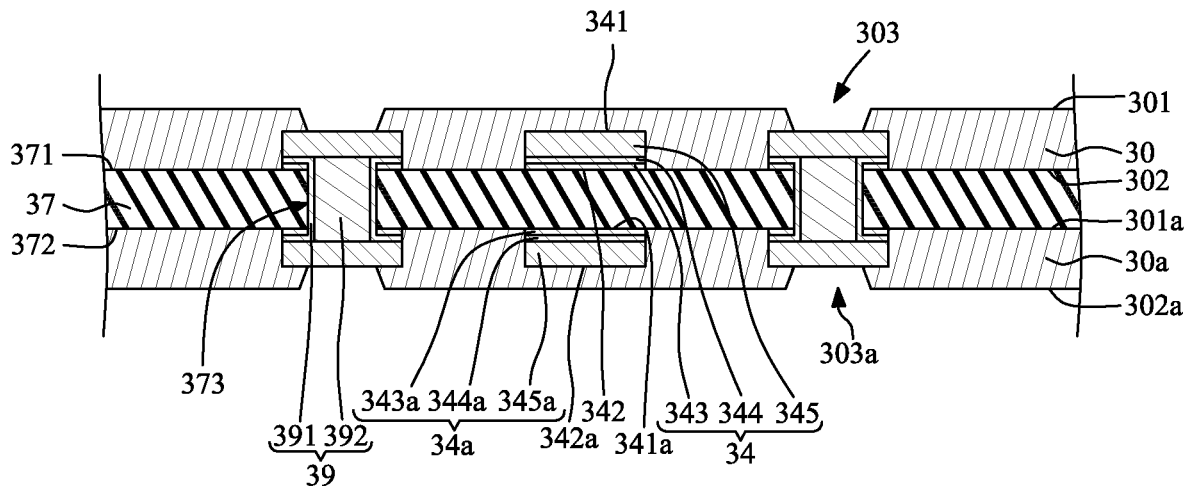
FIG. 18 illustrates one or more stages of an example of a method for manufacturing a wiring structure according to some embodiments of the present disclosure.

Referring to FIG. 18, a first upper dielectric layer 30 is formed or disposed on the top surface 371 of the core portion 37 to cover the top surface 371 of the core portion 37 and the first upper circuit layer 34 by a lamination technique or other suitable techniques. Meanwhile, a first lower dielectric layer 30*a* is formed or disposed on the bottom surface 372 of the core portion 37 to cover the bottom surface 372 of the core portion 37 and the first lower circuit layer 34*a* by a lamination technique or other suitable techniques. Then, at least one through hole 303 is formed to extend through the first upper dielectric layer 30 to expose a portion of the first upper circuit layer 34 by a drilling technique or other suitable techniques. Meanwhile, at least one through hole 303*a* is formed to extend through the first lower dielectric layer 30*a* to expose a portion of the first lower circuit layer 34*a* by a drilling technique or other suitable techniques.

Figure 19:
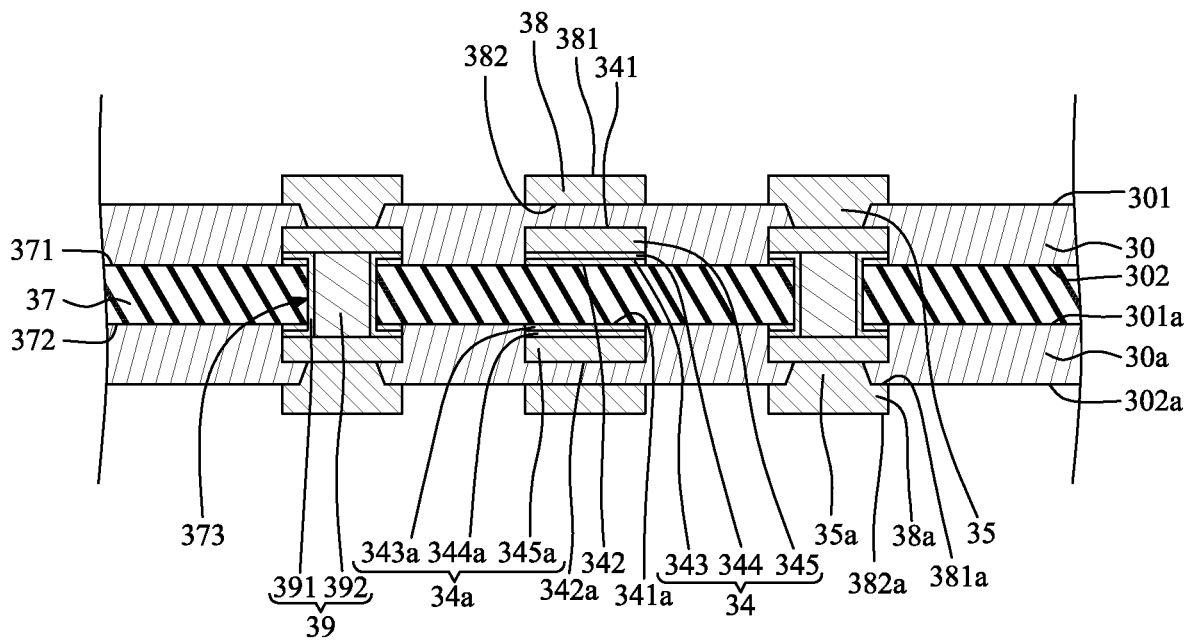
FIG. 19 illustrates one or more stages of an example of a method for manufacturing a wiring structure according to some embodiments of the present disclosure.

Referring to FIG. 19, a second upper circuit layer 38 is formed on the first upper dielectric layer 30, and an upper interconnection via 35 is formed in the through hole 303. Meanwhile, a second lower circuit layer 38*a* is formed on the first lower dielectric layer 30*a*, and a lower interconnection via 35*a* is formed in the through hole 303*a*.

Figure 20:
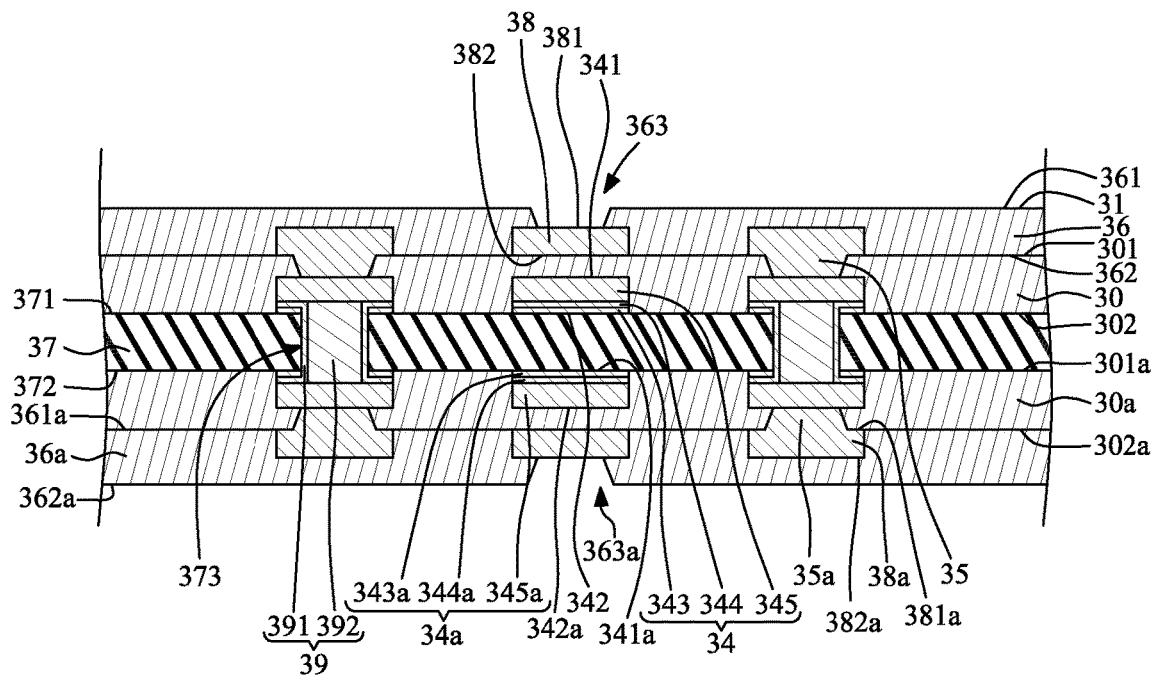
FIG. 20 illustrates one or more stages of an example of a method for manufacturing a wiring structure according to some embodiments of the present disclosure.

Referring to FIG. 20, a second upper dielectric layer 36 is formed or disposed on the top surface 301 of the first upper dielectric layer 30 to cover the top surface 301 of the first upper dielectric layer 30 and the second upper circuit layer 38 by a lamination technique or other suitable techniques. Meanwhile, a second lower dielectric layer 36*a* is formed or disposed on the bottom surface 302*a* of the first lower dielectric layer 30*a* to cover the bottom surface 302*a* of the first lower dielectric layer 30*a* and the second lower circuit layer 38*a* by a lamination technique or other suitable techniques. Then, at least one through hole 363 is formed to extend through the second upper dielectric layer 36 to expose a portion of the second upper circuit layer 38 by a drilling technique or other suitable techniques. Meanwhile, at least one through hole 363*a* is formed to extend through the second lower dielectric layer 36*a* to expose a portion of the second lower circuit layer 38*a* by a drilling technique or other suitable techniques.

Figure 21:
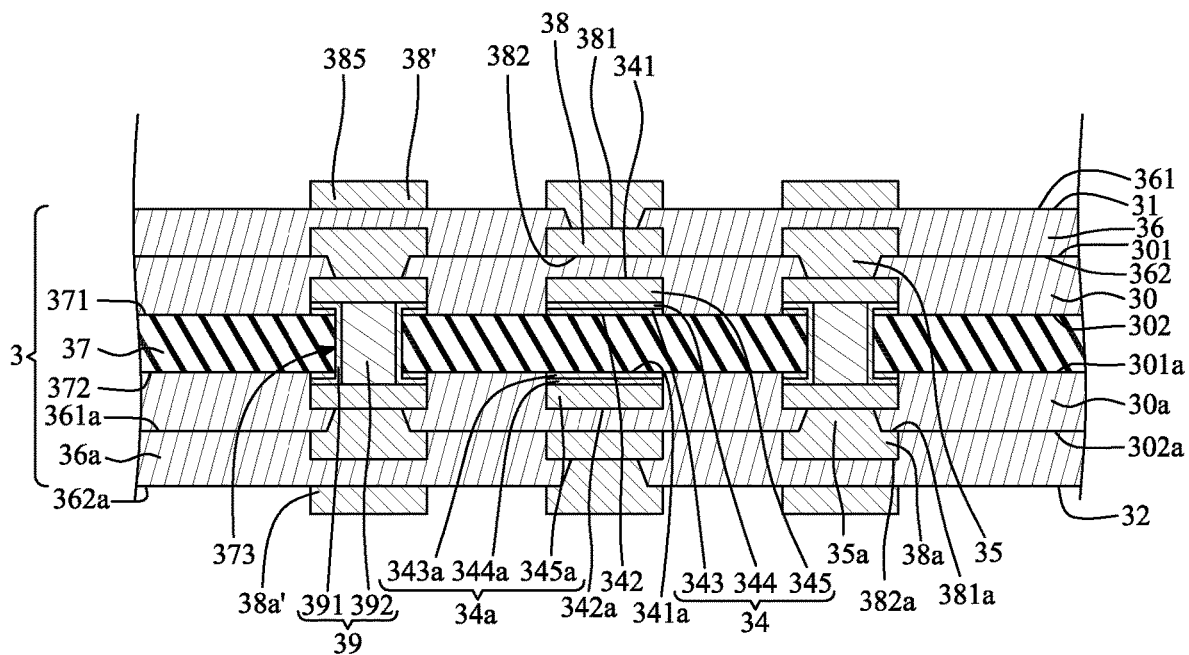
FIG. 21 illustrates one or more stages of an example of a method for manufacturing a wiring structure according to some embodiments of the present disclosure.

Referring to FIG. 21, a second upper circuit layer 38' is formed on the second upper dielectric layer 36, and an upper interconnection via 35 is formed in the through hole 363. Meanwhile, a second lower circuit layer 38*a*' is formed on the second lower dielectric layer 36*a*, and a lower interconnection via 35*a* is formed in the through hole 363*a*. It is noted that the second upper circuit layer 38' is the topmost circuit layer of the lower conductive structure 3, and may include a plurality of traces and a plurality of pads 385. However, in other embodiments, the second upper circuit layer 38' may solely include the pads 385.

Meanwhile, the lower conductive structure 3 is formed, and the dielectric layers (including, the first upper dielectric layer 30, the second upper dielectric layer 36, the first lower dielectric layer 30*a* and the second lower dielectric layer 36*a*) are cured. At least one of the circuit layers (including, for example, one first upper circuit layer 34, two second upper circuit layers 38, 38', one first lower circuit layer 34*a* and two second lower circuit layers 38*a*, 38*a*') is in contact with at least one of the dielectric layers (e.g., the first upper dielectric layer 30, the second upper dielectric layer 36, the first lower dielectric layer 30*a* and the second lower dielectric layer 36*a*). The lower conductive structure 3 may be a wafer structure, a strip structure or a panel structure. Then, an electrical property (such as open circuit/short circuit) of the lower conductive structure 3 is tested.

Figure 22:
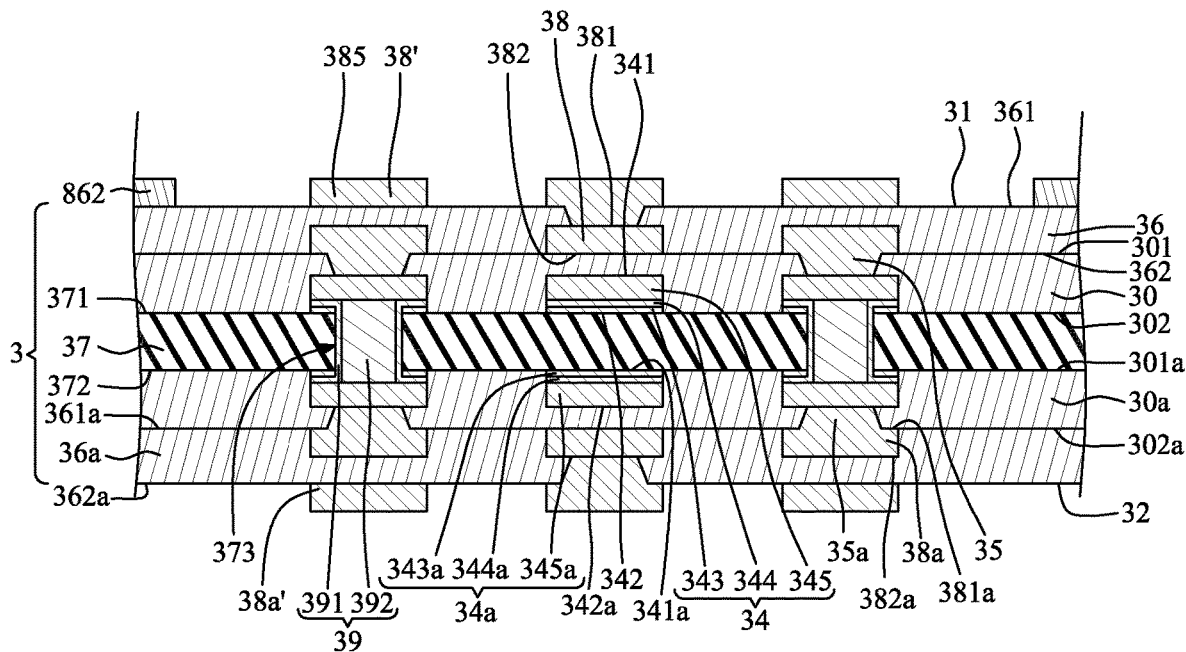
FIG. 22 illustrates one or more stages of an example of a method for manufacturing a wiring structure according to some embodiments of the present disclosure.

Referring to FIG. 22, a lower dent portion 862 is formed or disposed on the second upper dielectric layer 36 of the lower conductive structure 3. A thickness of the lower dent portion 862 may be greater than a thickness of the second upper circuit layer 38'.

Referring to FIG. 23 through FIG. 29, an upper conductive structure 2 is provided.

Figure 23:
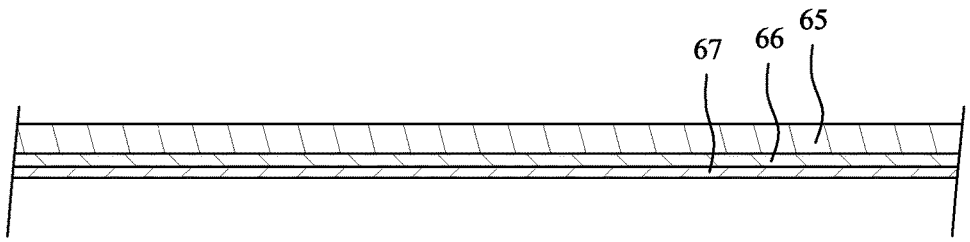
FIG. 23 illustrates one or more stages of an example of a method for manufacturing a wiring structure according to some embodiments of the present disclosure.

The upper conductive structure 2 is manufactured as follows. Referring to FIG. 23, a carrier 65 is provided. The carrier 65 may be a glass carrier, and may be in a wafer type, a panel type or a strip type. Then, a release layer 66 is coated on a bottom surface of the carrier 65. Then, a conductive layer 67 (e.g., a seed layer) is formed or disposed on the release layer 66 by a physical vapor deposition (PVD) technique or other suitable techniques.

Figure 24:
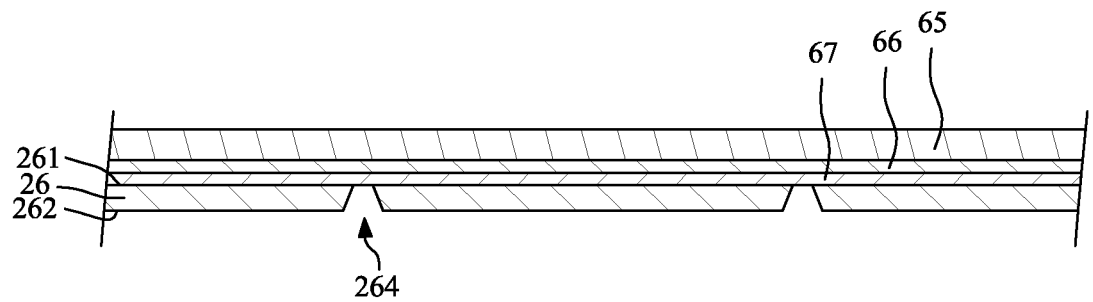
FIG. 24 illustrates one or more stages of an example of a method for manufacturing a wiring structure according to some embodiments of the present disclosure.

Referring to FIG. 24, a second dielectric layer 26 is formed on the conductive layer 67 by a coating technique or other suitable techniques. Then, at least one through hole 264 is formed to extend through the second dielectric layer 26 to expose a portion of the conductive layer 67 by an exposure and development technique or other suitable techniques.

Figure 25:
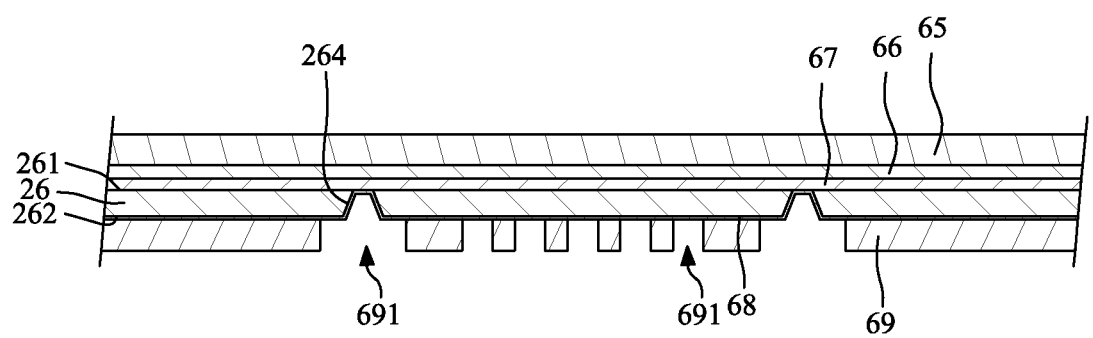
FIG. 25 illustrates one or more stages of an example of a method for manufacturing a wiring structure according to some embodiments of the present disclosure.

Referring to FIG. 25, a seed layer 68 is formed on a bottom surface 262 of the second dielectric layer 26 and in the through hole 264 by a PVD technique or other suitable techniques. Then, a photoresist layer 69 is formed on the seed layer 68. Then, the photoresist layer 69 is patterned to expose portions of the seed layer 68 by an exposure and development technique or other suitable techniques. The photoresist layer 69 defines a plurality of openings 691. At least one opening 691 of the photoresist layer 69 corresponds to, and is aligned with, the through hole 264 of the second dielectric layer 26.

Figure 26:
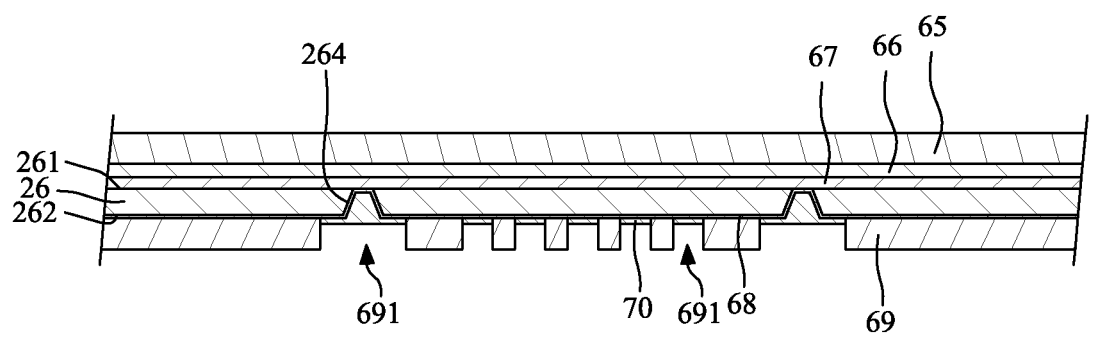
FIG. 26 illustrates one or more stages of an example of a method for manufacturing a wiring structure according to some embodiments of the present disclosure.

Referring to FIG. 26, a conductive material 70 (e.g., a metallic material) is disposed in the openings 691 of the photoresist layer 69 and on the seed layer 68 by a plating technique or other suitable techniques.

Figure 27:
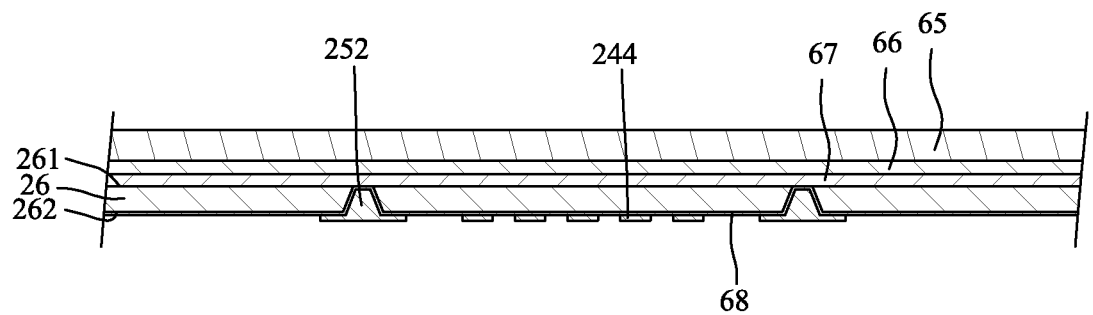
FIG. 27 illustrates one or more stages of an example of a method for manufacturing a wiring structure according to some embodiments of the present disclosure.

Referring to FIG. 27, the photoresist layer 69 is removed by a stripping technique or other suitable techniques.

Figure 28:
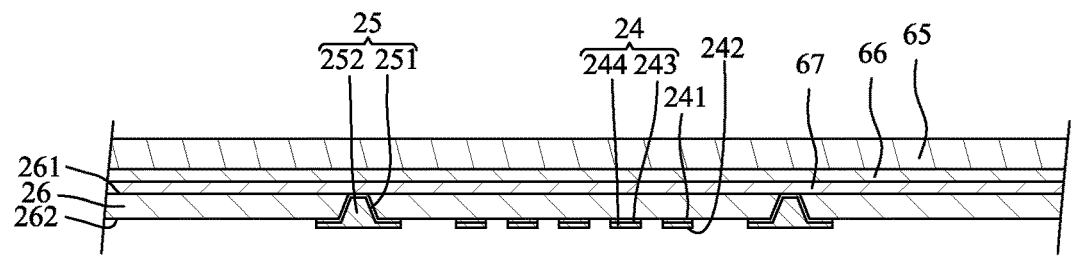
FIG. 28 illustrates one or more stages of an example of a method for manufacturing a wiring structure according to some embodiments of the present disclosure.

Referring to FIG. 28, portions of the seed layer 68 that are not covered by the conductive material 70 are removed by an etching technique or other suitable techniques. Meanwhile, a circuit layer 24 and at least one inner via 25 are formed.

Figure 29:
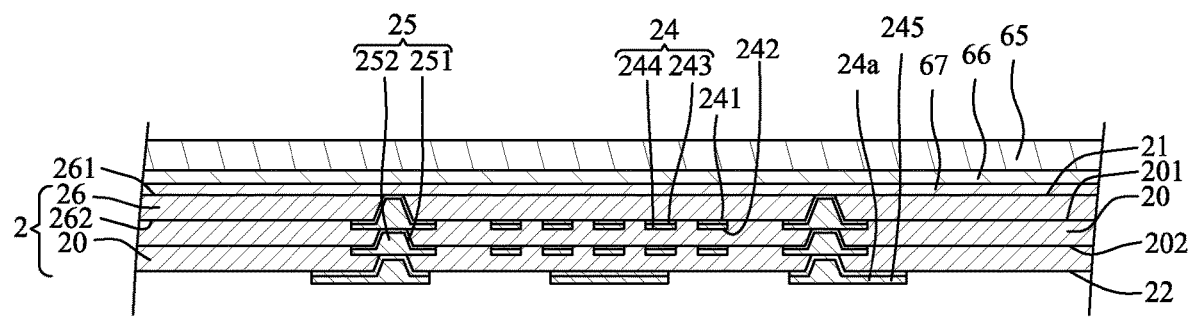
FIG. 29 illustrates one or more stages of an example of a method for manufacturing wiring structure according to some embodiments of the present disclosure.

Referring to FIG. 29, a plurality of first dielectric layers 20 and a plurality of circuit layers (including the first circuit layer 24 and the bottommost circuit layer 24*a*) are formed by repeating the stages of FIG. 24 to FIG. 28. In some embodiments, the bottommost circuit layer 24*a* may include a plurality of traces and a plurality of pads 245. However, in other embodiments, the bottommost circuit layer 24*a* may solely include the pads 245. Meanwhile, the upper conductive structure 2 is formed, and the dielectric layers (including, the first dielectric layers 20 and the second dielectric layer 26) are cured. At least one of the circuit layers (including, for example, the first circuit layers 24 and the bottommost circuit layer 24*a*) is in contact with at least one of the dielectric layers (e.g., the first dielectric layers 20 and the second dielectric layer 26). The upper conductive structure 2 may be a wafer structure, a strip structure or a panel structure. Then, an electrical property (such as open circuit/short circuit) of the upper conductive structure 2 is tested.

Figure 30:
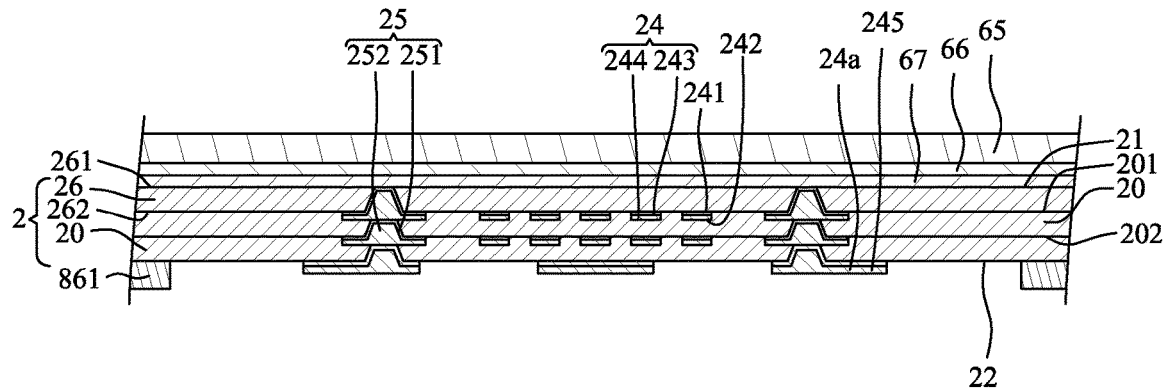
FIG. 30 illustrates one or more stages of an example of a method for manufacturing a wiring structure according to some embodiments of the present disclosure.

Referring to FIG. 30, an upper dent portion 861 is formed or disposed on the bottommost first dielectric layer 20 of the upper conductive structure 2.

Figure 31:
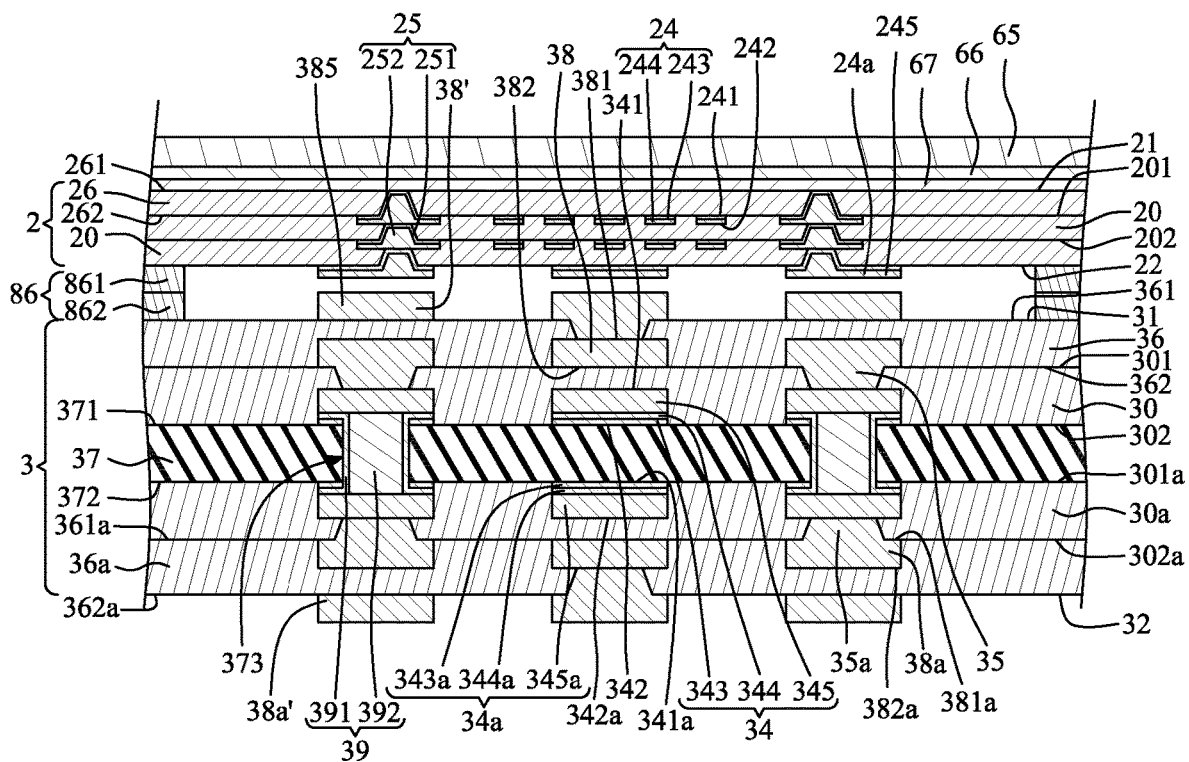
FIG. 31 illustrates one or more stages of an example of a method for manufacturing a wiring structure according to some embodiments of the present disclosure.

Referring to FIG. 31, the upper conductive structure 2 is attached to the lower conductive structure 3 through the upper dent portion 861 and the lower dent portion 862. The upper dent portion 861 is in contact with or adhered to the lower dent portion 862 to form a dent structure 86 so as to provide a gap between the pads 245 of the bottommost circuit layer 24*a* of the upper conductive structure 2 and the pads 385 of the second upper circuit layer 38' of the lower conductive structure 3. Further, the dent structure 86 also form a gap between the upper conductive structure 2 and the lower conductive structure 3. In some embodiments, a size and a spacing of the pads 385 of the second upper circuit layer 38' of the lower conductive structure 3 is substantially equal to a size and a spacing of the pads 245 of the bottommost circuit layer 24*a* of the upper conductive structure 2. In addition, a position of each of the pads 385 of the second upper circuit layer 38' of the lower conductive structure 3 corresponds to a position of each of the pads 245 of the bottommost circuit layer 24*a* of the upper conductive structure 2.

Figure 32:
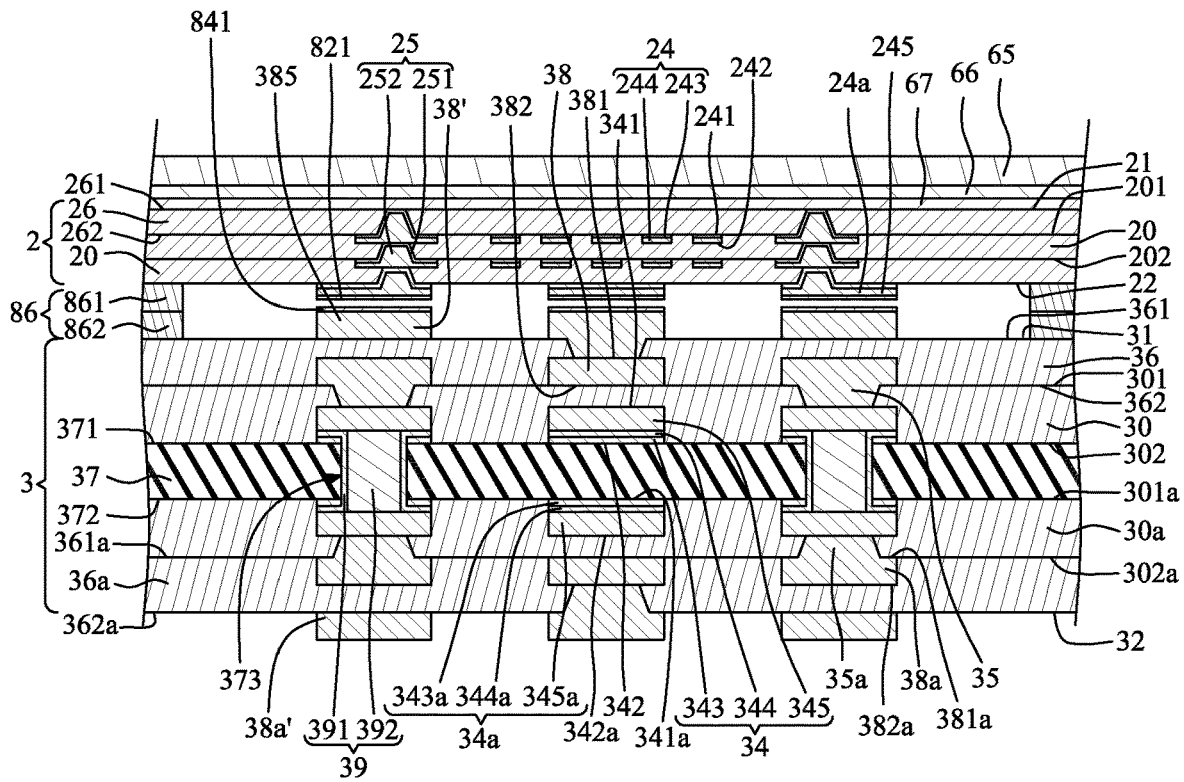
FIG. 32 illustrates one or more stages of an example of a method for manufacturing a wiring structure according to some embodiments of the present disclosure.

Referring to FIG. 32, a plurality of first upper layers 821 and a plurality of first lower layers 841 are formed concurrently by, for example, depositing such as electroplating, electroless plating, chemical vapor deposition (CVD) or physical vapor deposition (PVD). The first upper layer 821 is disposed on a circuit layer (such as the pad 245 of the bottommost circuit layer 24*a*) of the upper conductive structure 2, and the first lower layer 841 is disposed on a circuit layer (such as the pads 385 of the second upper circuit layer 38') of the lower conductive structure 3. A material of the first upper layer 821 is same as a material of the first lower layer 841, and a thickness of the first upper layer 821 is substantially equal to a thickness of the first lower layer 841. In some embodiments, the material of the first upper layer 821 and the first lower layer 841 both includes nickel.

Figure 33:
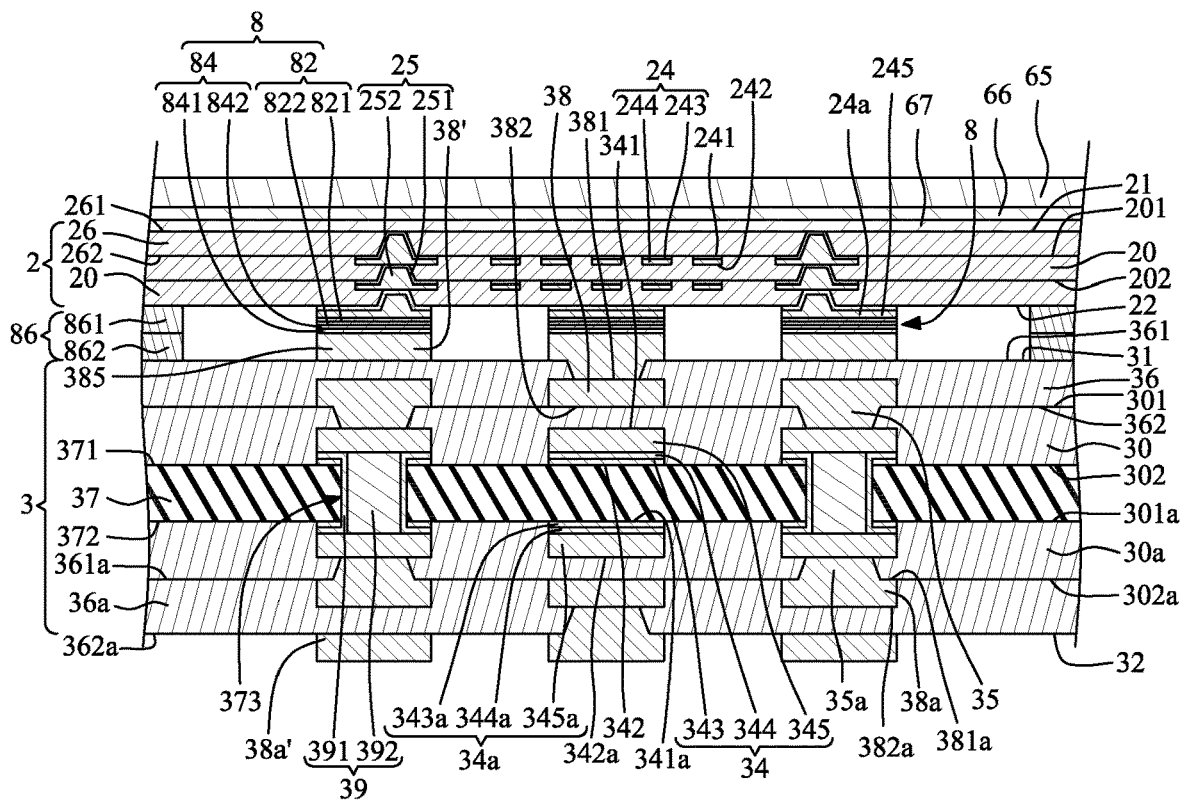
FIG. 33 illustrates one or more stages of an example of a method for manufacturing a wiring structure according to some embodiments of the present disclosure.

Referring to FIG. 33, a plurality of second upper layers 822 and a plurality of second lower layers 842 are formed concurrently by, for example, depositing such as electroplating, electroless plating, chemical vapor deposition (CVD) or physical vapor deposition (PVD). The second upper layer 822 is disposed on the first upper layer 821, and the second lower layer 842 is disposed on the first lower layer 841. A material of the second upper layer 822 is same as a material of the second lower layer 842, and a thickness of the second upper layer 822 is substantially equal to a thickness of the second lower layer 842. In some embodiments, the material of the second upper layer 822 and the second lower layer 842 may include palladium or gold.

Meanwhile, the second upper layers 822 and the first upper layers 821 form a plurality of upper metallic portions 82. The second lower layers 842 and the first lower layers 841 form a plurality of lower metallic portions 84. The upper metallic portions 82 are in contact with the exposed portion of the circuit layer (such as the pads 245 of the bottommost circuit layer 24*a*) of the upper conductive structure 2, and the lower metallic portions 84 are in contact with the exposed portion of the circuit layer (such as the pads 385 of the second upper circuit layer 38') of the lower conductive structure 3. The upper metallic portions 82 connect or adhere the lower metallic portions 84 to form a plurality of metallic structures 8.

Figure 34:
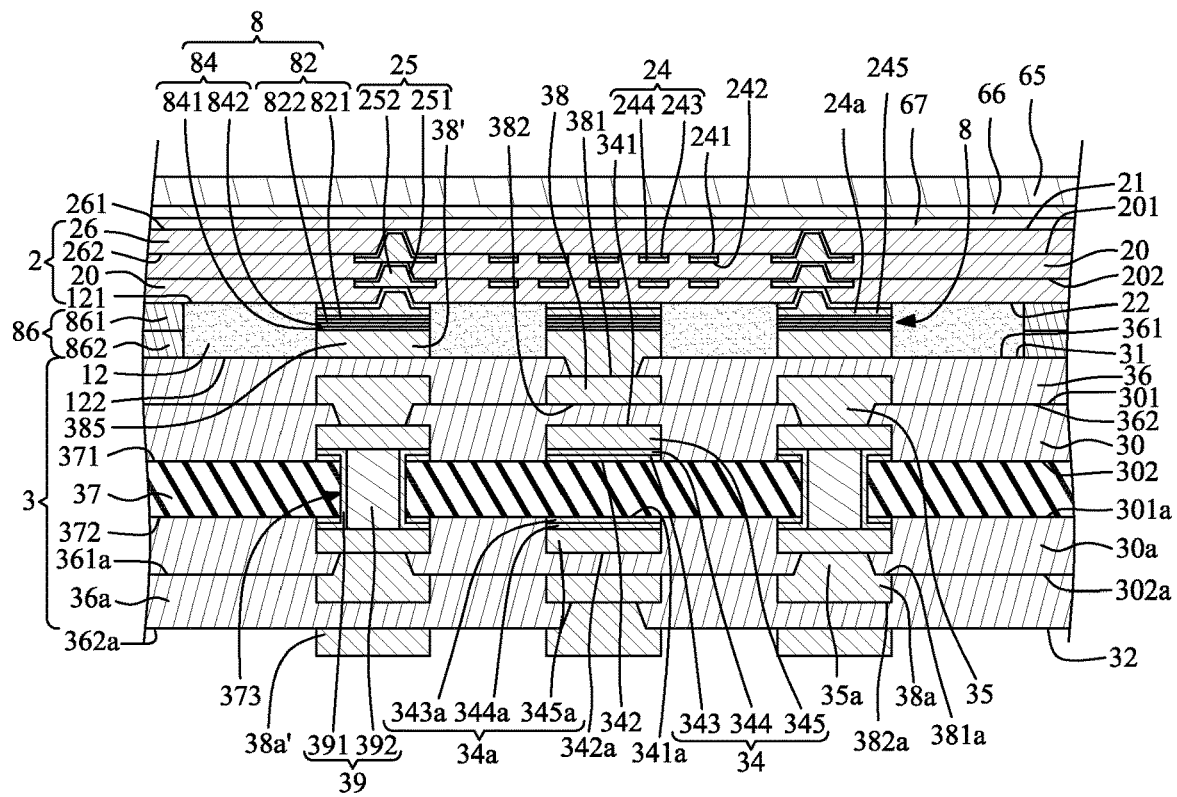
FIG. 34 illustrates one or more stages of an example of a method for manufacturing a wiring structure according to some embodiments of the present disclosure.

Referring to FIG. 34, an adhesive layer 12 is applied into the gap between the upper conductive structure 2 and the lower conductive structure 3 to bond the lower conductive structure 3 and the upper conductive structure 2 together, and to cover the metallic structures 8. Then, the adhesive layer 12 is cured to form an intermediate layer 12.

Figure 35:
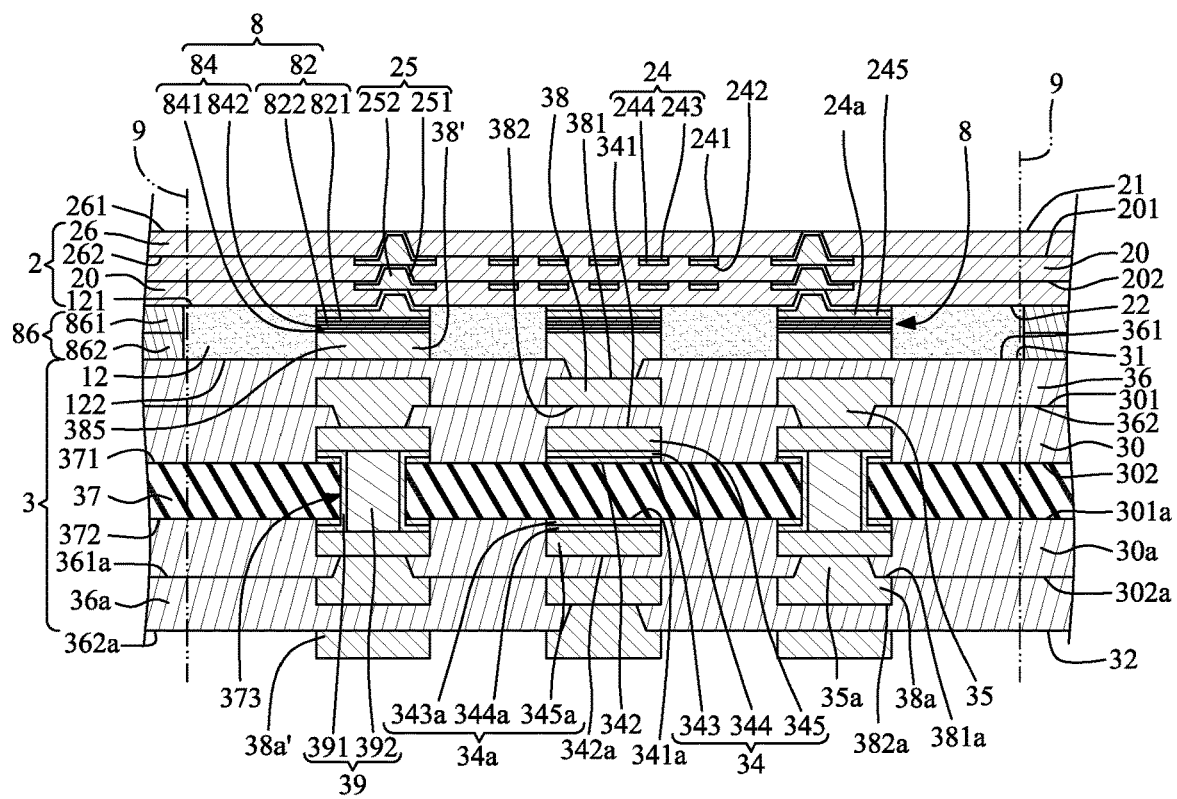
FIG. 35 illustrates one or more stages of an example of a method for manufacturing a wiring structure according to some embodiments of the present disclosure.

Referring to FIG. 35, the carrier 65, the release layer 66 and the conductive layer 67 are removed. Then, a second circuit layer 28 is formed or disposed on the top surface 21 of the upper conductive structure 2, so as to obtain the wiring structure 1 of FIG. 1 or the wiring structure 1*e* of in FIG. 6. It is noted that FIG. 1 selectively shows a region of the wiring structure 1 without the dent structure 86.

In some embodiments, a singulation process is conducted along the saw streets 9 to form a plurality of wiring structures 1*g* of FIG. 9. The wiring structure 1*g* of FIG. 9 includes a singulated upper conductive structure 2*g* and a singulated lower conductive structure 3*g*. That is, a lateral peripheral surface 27*g* of the upper conductive structure 2*g*, a lateral peripheral surface 33*g* of the lower conductive structure 3*g* and a lateral peripheral surface of the intermediate layer 12 are substantially coplanar with each other. Then, a semiconductor chip 42 (FIG. 9) is electrically connected and bonded to the second circuit layer 28 of the upper conductive structure 2 through a plurality of first connecting elements 44 (e.g., solder bumps or other conductive bumps), so as to from a package structure 4 as shown in FIG. 9. Then, the second lower circuit layer 38*a'* of the lower conductive structure 3*g* is electrically connected and bonded to a substrate 46 (e.g., a mother board such as a PCB) through a plurality of second connecting elements 48 (e.g., solder bumps or other conductive bumps).

Figure 36:
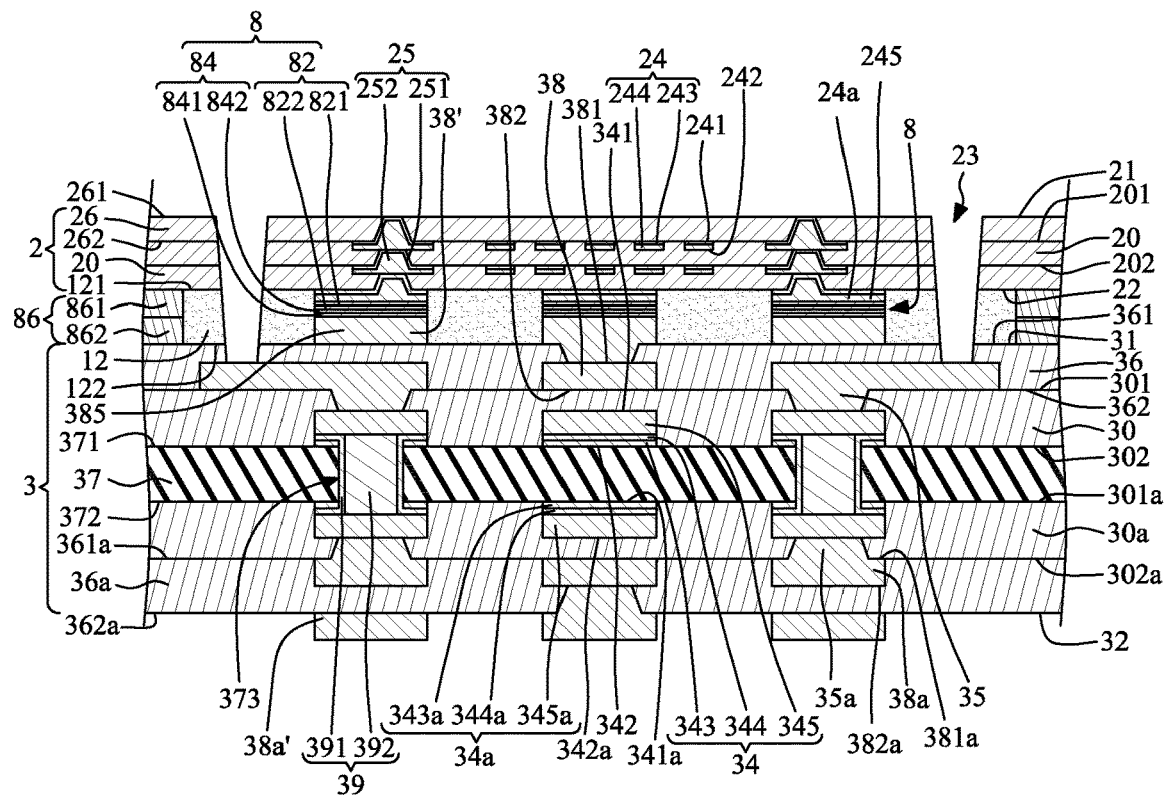
FIG. 36 illustrates one or more stages of an example of a method for manufacturing a wiring structure according to some embodiments of the present disclosure.

FIG. 36 through FIG. 39 illustrate a method for manufacturing a wiring structure according to some embodiments of the present disclosure. In some embodiments, the method is for manufacturing the wiring structure 1*d* shown in FIG. 5. The initial stages of the illustrated process are the same as, or similar to, the stages illustrated in FIG. 10 to FIG. 35. FIG. 36 depicts a stage subsequent to that depicted in FIG. 35.

Referring to FIG. 36, at least one hole 23 is formed to extend through the upper conductive structure 2, the intermediate layer 12 and a portion of the lower conductive structure 3 by drilling (such as laser drilling) to exposes a circuit layer (e.g., second upper circuit layers 38) of the lower conductive structure 3. In some embodiments, the hole 23 tapers downwardly.

Figure 37:
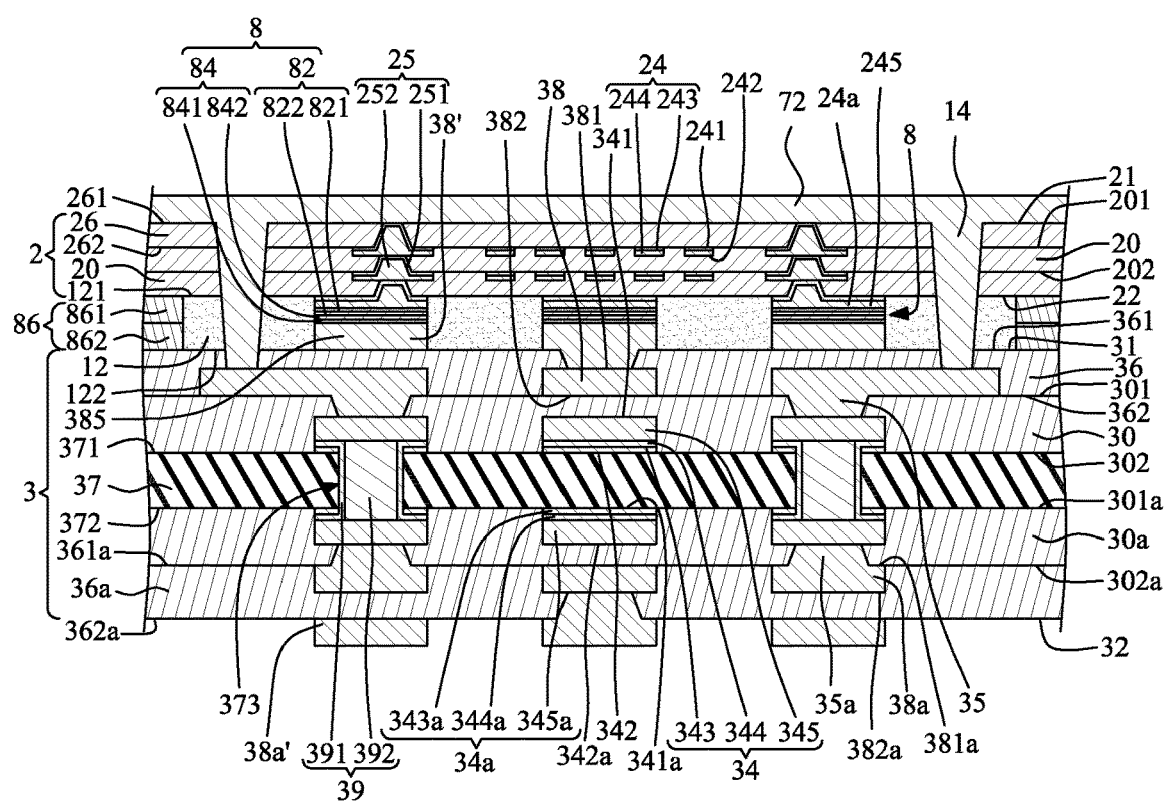
FIG. 37 illustrates one or more stages of an example of a method for manufacturing a wiring structure according to some embodiments of the present disclosure.

Referring to FIG. 37, a metallic layer 72 is formed or disposed on the top surface 21 of the upper conductive structure 2 and in the hole 23 to form at least one conductive via 14 in the hole 23 by plating technique or other suitable technique(s).

Figure 38:
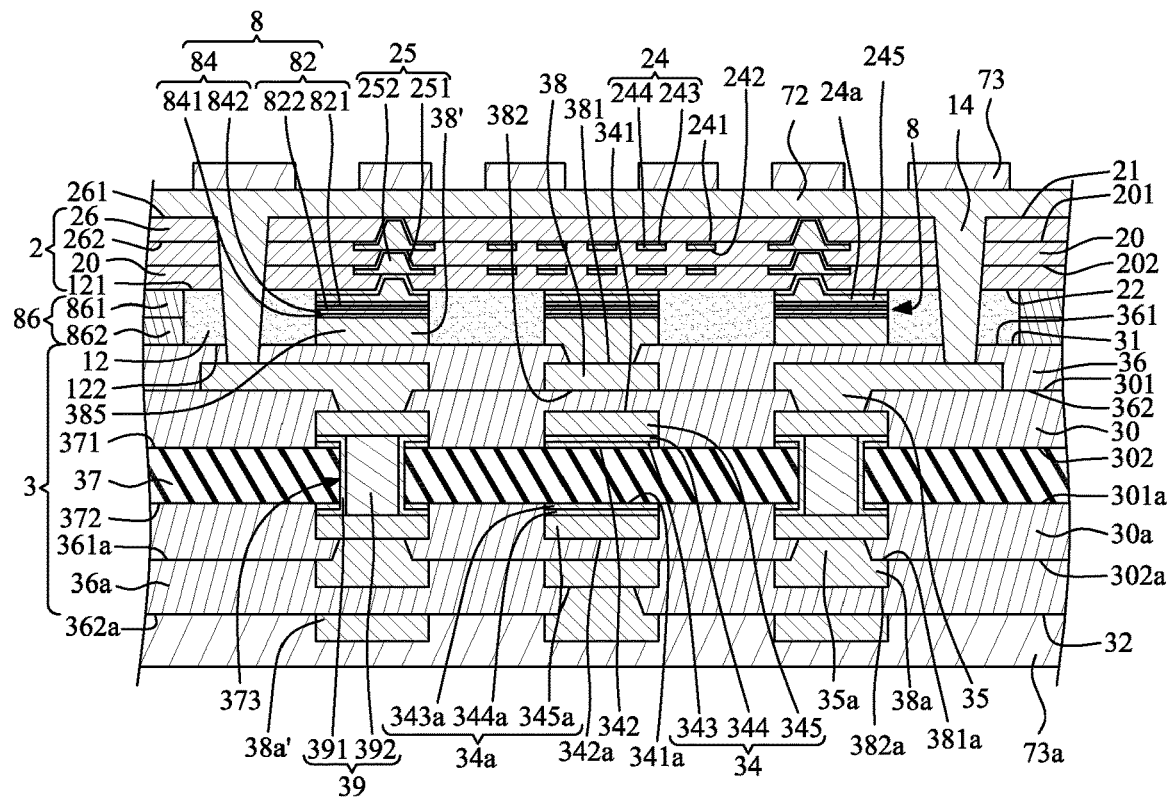
FIG. 38 illustrates one or more stages of an example of a method for manufacturing a wiring structure according to some embodiments of the present disclosure.

Referring to FIG. 38, a top photoresist layer 73 is formed or disposed on the metallic layer 72, and a bottom photoresist layer 73*a* is formed or disposed on the bottom surface 32 of the lower conductive structure 3. Then, the top photoresist layer 73 is patterned by exposure and development technique or other suitable technique(s).

Figure 39:
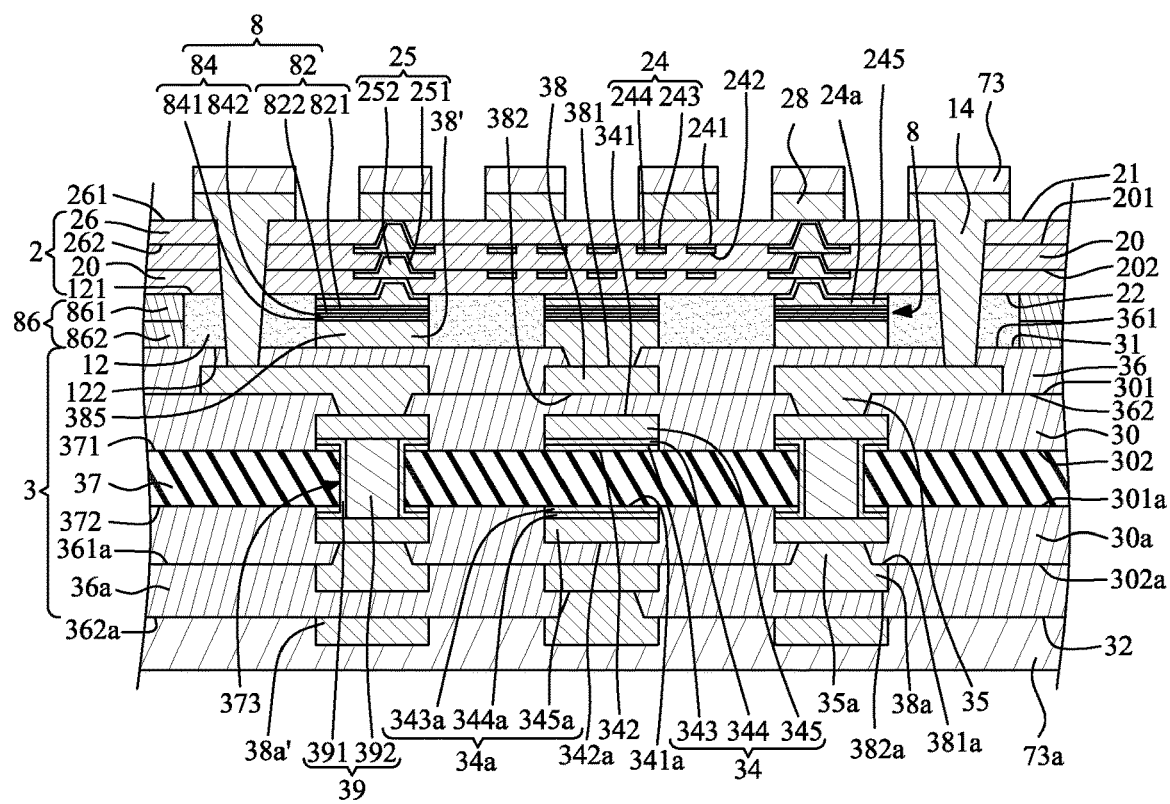
FIG. 39 illustrates one or more stages of an example of a method for manufacturing a wiring structure according to some embodiments of the present disclosure.

Referring to FIG. 39, the portions of the metallic layer 72 that are not covered by the top photoresist layer 73 is removed by etching technique or other suitable technique(s). The portions of the metallic layer 72 that are covered by the top photoresist layer 73 remain to form a second circuit layer 28. Then, the top photoresist layer 73 and the bottom photoresist layer 73a are removed by stripping technique or other suitable technique(s), so as to obtain the wiring structure 1d of FIG. 5. It is noted that FIG. 1 selectively shows a region of the wiring structure 1d without the dent structure 86.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A wiring structure, comprising:
    an upper conductive structure including at least one dielectric layer and at least one circuit layer in contact with the dielectric layer;
    a lower conductive structure including at least one dielectric layer and at least one circuit layer in contact with the dielectric layer;
    a plurality of metallic structures disposed between the upper conductive structure and the lower conductive structure, and electrically connecting the upper conductive structure and the lower conductive structure;
    an intermediate layer disposed between the upper conductive structure and the lower conductive structure, and covering the metallic structures; and
    at least one dent structure disposed between the upper conductive structure and the lower conductive structure, wherein an upper end of the dent structure contacts a dielectric layer of the upper conductive structure, and a lower end of the dent structure contacts a dielectric layer of the lower conductive structure,
    wherein each of the metallic structures includes an upper metallic portion in contact with one of the at least one circuit layer of the upper conductive structure, and a lower metallic portion in contact with one of the at least one circuit layer of the lower conductive structure, wherein the upper metallic portion of the metallic structure is symmetrical with the lower metallic portion of the metallic structure, and
    wherein the upper metallic portion of the metallic structure includes a first upper layer disposed on one of the at least one circuit layer of the upper conductive structure, and the lower metallic portion of the metallic structure includes a first lower layer disposed on one of the at least one circuit layer of the lower conductive structure, wherein a material of the first upper layer is same as a material of the first lower layer.

2. The wiring structure of claim 1, wherein an upper end of each of the metallic structures contacts one of the at least one circuit layer of the upper conductive structure, and a lower end of each of the metallic structures contacts one of the at least one circuit layer of the lower conductive structure.

3. The wiring structure of claim 1, wherein each of the metallic structures is an electroless plating structure.

4. The wiring structure of claim 1, wherein the upper metallic portion of the metallic structure is in contact with the lower metallic portion of the metallic structure.

5. The wiring structure of claim 1, wherein each of the metallic structures further includes a second upper layer disposed on the first upper layer, and a second lower layer disposed on the first lower layer, wherein a material of the second upper layer is same as a material of the second lower layer.

6. The wiring structure of claim 5, wherein the second upper layer is in contact with the second lower layer.

7. The wiring structure of claim 5, wherein the material of the first upper layer includes nickel and the material of the second upper layer includes palladium or gold.

8. The wiring structure of claim 1, wherein the dent structure includes an upper dent portion disposed on the dielectric layer of the upper conductive structure, and a lower dent portion disposed on the dielectric layer of the lower conductive structure, wherein the upper dent portion is in contact with the lower dent portion.

9. The wiring structure of claim 1, wherein a thickness of the first upper layer is substantially equal to a thickness of the first lower layer.

10. A wiring structure, comprising:
a low-density stacked structure including at least one dielectric layer and at least one low-density circuit layer in contact with the dielectric layer;
a high-density stacked structure including at least one dielectric layer and at least one high-density circuit layer in contact with the dielectric layer;
a plurality of metallic structures disposed between the high-density stacked structure and the low-density stacked structure, and electrically connecting the high-density stacked structure and the low-density stacked structure, wherein a material of each of the metallic structures includes at least one build-up metal layer, wherein a line space of the low-density circuit layer of the low-density stacked structure is greater than a line space of the high-density circuit layer of the high-density stacked structure; and
at least one dent structure disposed between the high-density stacked structure and the low-density stacked structure, wherein an upper end of the dent structure contacts a dielectric layer of the high-density stacked structure, and a lower end of the dent structure contacts a dielectric layer of the low-density stacked structure.

11. The wiring structure of claim 10, wherein the low-density stacked structure further includes a core portion, and the at least one dielectric layer and the at least one low-density circuit layer of the low-density stacked structure are disposed adjacent to a surface of the core portion.

12. The wiring structure of claim 10, wherein each of the metallic structures includes an upper metallic portion in contact with a high-density circuit layer of the high-density stacked structure, and a lower metallic portion in contact with a lower-density circuit layer of the low-density stacked structure, wherein the upper metallic portion of the metallic structure is mirrored with the lower metallic portion of the metallic structure.

13. The wiring structure of claim 10, further comprising at least one conductive via extending through the low-density stacked structure, the high-density stacked structure or the wiring structure, and electrically connecting the low-density stacked structure and the high-density stacked structure.

14. A method for manufacturing a wiring structure, comprising:
(a) providing a lower conductive structure, an upper conductive structure and at least one dent structure, wherein the at least one dent structure is disposed between the upper conductive structure and the lower conductive structure to form a gap between the upper conductive structure and the lower conductive structure, wherein a portion of a circuit layer of the upper conductive structure and a portion of a circuit layer of the lower conductive structure are exposed in the gap and aligned with each other; and
(b) concurrently forming a plurality of upper metallic portions in contact with the exposed portion of the circuit layer of the upper conductive structure, and a plurality of lower metallic portions in contact with the exposed portion of the circuit layer of the lower conductive structure, wherein the upper metallic portions connect the lower metallic portions to form a plurality of metallic structures.

15. The method of claim 14, wherein in (b), the upper metallic portions and the lower metallic portions are formed by depositing.

16. The method of claim 15, wherein in (b), the upper metallic portions and the lower metallic portions are formed by electroplating, electroless plating, chemical vapor deposition (CVD) or physical vapor deposition (PVD).

17. The method of claim 14, wherein after (b), the method further comprises:
(c) applying an adhesive layer into the gap to bond the lower conductive structure and the upper conductive structure together.

18. The method of claim 14, wherein after (b), the method further comprises:
(c) forming at least one conductive via extending through the lower conductive structure and/or the upper conductive structure, wherein the upper conductive structure is electrically connected to the lower conductive structure through the conductive via.

* * * * *